(12) United States Patent
Tsuruko

(10) Patent No.: US 7,687,906 B2
(45) Date of Patent: Mar. 30, 2010

(54) CONNECTING STRUCTURE, METHOD FOR FORMING BUMP, AND METHOD FOR PRODUCING DEVICE-MOUNTING SUBSTRATE

(75) Inventor: Masanori Tsuruko, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 7 days.

(21) Appl. No.: 11/729,115

(22) Filed: Mar. 28, 2007

(65) Prior Publication Data

US 2007/0228559 A1 Oct. 4, 2007

(30) Foreign Application Priority Data

Mar. 31, 2006 (JP) ............................. 2006-099088

(51) Int. Cl.
*H01L 23/48* (2006.01)
*H01L 23/52* (2006.01)
*H01L 29/40* (2006.01)

(52) U.S. Cl. ........................ 257/737; 257/337; 257/338; 257/E23.069; 257/E23.07; 438/254

(58) Field of Classification Search ................. 257/737, 257/338, E23.069, E23.07, 337; 438/254; 362/458
See application file for complete search history.

(56) References Cited

U.S. PATENT DOCUMENTS

| 5,891,366 | A | * | 4/1999 | Gruenwald et al. | .......... 252/514 |
| 6,101,708 | A | * | 8/2000 | Okano et al. | ................... 29/832 |
| 2004/0028893 | A1 | * | 2/2004 | Inoue et al. | ................. 428/328 |
| 2004/0257516 | A1 | * | 12/2004 | Sugimoto et al. | ........... 349/151 |
| 2006/0211280 | A1 | * | 9/2006 | Igarashi et al. | ................ 439/91 |

FOREIGN PATENT DOCUMENTS

JP  2002-43363   2/2002
JP  2002-261416  9/2002

\* cited by examiner

*Primary Examiner*—Cuong Q Nguyen
*Assistant Examiner*—Cathy N Lam
(74) *Attorney, Agent, or Firm*—Eugene LeDonne; Joseph W. Treloar; Frommer Lawrence & Haug

(57) ABSTRACT

A connecting terminal provided on a substrate and a connector provided on an electronic device are connected via a bump formed of a first member, which is formed of an anisotropic conductive paste including particles of a conductive material, and a second member which is different in conductivity from the first member. According to such a structure, since the anisotropic conductive paste which is softer as compared to a solder bump is used, stress applied to an interface between the bump and the connecting terminal is relaxed. Accordingly, reliability of connection can be assured even when using a substrate with large surface irregularities and/or bending, in which stress occurs relatively easily in a connection part of the bump and the connecting terminal.

10 Claims, 28 Drawing Sheets

CONNECTING STRUCTURE, METHOD FOR FORMING BUMP, AND METHOD FOR PRODUCING DEVICE-MOUNTING SUBSTRATE

CROSS REFERENCE TO RELATED APPLICATION

The present application claims priority from Japanese Patent Application No. 2006-099088, filed on Mar. 31, 2006, the disclosure of which is incorporated herein by reference in its entirety.

BACKGROUND OF THE INVENTION

1. Field of the Invention

The present invention relates to a connecting structure which electrically connects a connecting terminal provided on a substrate and a connector provided on an electronic device by a bump formed of an anisotropic conductive paste, a method for forming a bump by an anisotropic conductive paste, and a method for producing a device-mounting substrate which joins a substrate and an electronic device by a bump formed of an anisotropic conductive paste.

2. Description of the Related Art

For example, as a technique to mount an LSI chip on a substrate, connecting a connecting terminal on the LSI chip and a connecting terminal on the substrate via a solder ball is mostly common. However, since the solder is hard material, distortion may be generated in a connecting portion thereof due to concentration of stress when the aforementioned technique is applied to a substrate having large surface irregularities, a substrate having poor positioning accuracy of connecting terminals, or a hard substrate such as ceramic substrate. Further, in a long term, there is possibility that stress crack may be generated in solder due to residual stress.

To solve such problems, as a technique to realize alleviation of stress at low cost, there is proposed a connecting structure using an anisotropic conductive film (ACF) (for example, Japanese Patent Applications Laid-open Nos. 2002-43363, 2002-261416). This anisotropic conductive film is made by dispersing conductive material particles in a binder formed of resin and making this binder to a film form, in which, when being compressed by applying a constant load, the particles of the conductive material contact each other to thereby have a conductivity in a compressive direction. In a connecting structure using such an anisotropic conductive film, the resin as a soft material relaxes the stress, and thus a crack is not easily generated as compared to the case where connecting portions are formed only with solder as in a conventional technique.

SUMMARY OF THE INVENTION

Incidentally, in the connecting structure using the anisotropic conductive film, conductive particles also exist in an intermediate region between adjacent terminals. The conductive particles existing in this intermediate region do not contribute to conduction between the terminals, and moreover, there is possible that insulation between the adjacent terminals is disturbed and/or a short circuit is generated due to application of pressurizing force to this intermediate region by some kind of cause. In particular, along with demands for reduction in size and increasing performance of electronic equipment, the distance between terminals tend to be narrow, and therefore there is a strong demand for development of a technique that enables secure connection only in a portion where conduction is needed.

The present invention is made in view of the above-described situation, and an object thereof is to provide a connecting structure capable of ensuring reliability of connection between a substrate and an electronic device. It should be noted that parenthesized reference numerals assigned to elements below are only examples of the elements, and are not intended to limit the elements.

According to a first aspect of the present invention, there is provided a connecting structure which electrically connects a connecting terminal (14) provided on a substrate (10) and a connector (21) provided on an electronic device (20), the connecting structure including a bump (15) formed of a first member (16), which is formed of a first anisotropic conductive paste (P1) including particles of a conductive material (M), and a second member (17) which is different in conductivity from the first member, wherein the connecting terminal and the connector are connected via the bump.

Here, the "anisotropic conductive paste" is one made in a paste form by dispersing particles of a conductive material such as metal in a binder formed of thermoset resin or the like. The anisotropic conductive paste has a conductivity in a compressive direction by being compressed between the connecting terminal and the connector with a constant load, thereby causing the particles of the conductive material to contact each other and form a conductive path. According to the connecting structure of the present invention, the bump is formed of the first member formed of the anisotropic conductive paste and the second member which is different in conductivity from the first member. Accordingly, depending on an arrangement relationship of the first member and the second member in the bump, a portion having higher conductivity and a portion having lower conductivity can be formed. In this case, in the portion having higher conductivity, conduction of the connecting terminal on the substrate and the electronic device can be assured by a weaker pressurizing force. Therefore, even when a distance between the connecting terminal and the connector is large and a sufficient compressive force cannot be applied, the bump formed of the first member and the second member can assure electrical connection of the connecting terminal and the connector. Further, since the first member is formed of the anisotropic conductive paste, the thermoset resin included in the anisotropic conductive paste can relax a stress applied to an interface between the bump and the connecting terminal. Therefore, reliability of connection can be assured even when using a substrate with large surface irregularities and/or bending, in which stress occurs relatively easily in a connector. Further, being different from the case of using an anisotropic conductive film, the conductive material does not exist in a region except positions where the connecting terminal and the connector are provided. Accordingly, short-circuit or the like does not occur, and insulating characteristics between adjacent connecting terminals and connectors can be maintained.

In the connecting structure of the present invention, the second member (17) may be formed of a conductive material and formed in the first member (16) to penetrate the first member from a connecting surface (16B) for the connecting terminal (14) to another connecting surface (16A) for the connector (21). In this case, since conduction of the connecting terminal on the substrate and the connector on the electronic device can be assured by the second member formed of a conductive material, electrical connection of the both can be assured independent of the pressurizing force to the bump. Note that, the "connecting surface" means not only a surface which makes direct contact with the connecting terminal or the connector, but also a surface which is electrically connected with the connecting terminal or the connector through any conductive material (See the second embodiment).

In the connecting structure of the present invention, the bump (31) may have a conductive film (34) formed of a conductive material; the conductive film may be formed between the first member (32) and at least one of the connecting terminal (14) and the connector (21), and may be connected to the second member (33). In this case, the conductive film connected to the second member makes contact with the connecting terminal or the connector as a surface. Therefore, in the case where an accuracy in positions of the connecting terminal on the substrate and the connector on the electronic device is low, the connector and the connecting terminal surely conduct to each other via the second member and the conductive film. Note that the conductive material forming the particles in the anisotropic conductive paste and the conductive materials forming the second member and the conductive film may either be the same or different. Further, the second member and the conductive film may be formed of the same conductive material or may be formed of different conductive materials.

In the connecting structure of the present invention, the conductive film (34) may entirely cover an exposed surface (32A and 32B) of the first member (32). In this case, the durability of the bump can be improved by entirely covering the exposed surface (surface not in contact with either the substrate or the electronic device) of the first member by the conductive film.

In the connecting structure of the present invention, the second member (43) may be formed of a second anisotropic conductive paste (P2) which is different in density of the conductive material (M) from that of the first anisotropic conductive paste (P1), and may be formed in the first member (42) to penetrate the first member from a connecting surface (42B) for the connecting terminal (14) to another connecting surface (42A) for the connector (21). In this case, a member having higher conductivity, out of the first member and the second member, can assure conduction between the connecting terminal on the substrate and the connector on the electronic device even when a weaker pressurizing force is applied. Therefore, even when a distance between the connecting terminal and the connector is large and a sufficient compressive force cannot be applied, the bump formed of the first member and the second member can assure electrical connection of the connecting terminal and the connector. Further, since both the first member and the second member are formed of anisotropic conductive pastes, the first member and the second member have more flexibility as compared to the bump formed only of the conductive material, and a stress applied to the bump can be relaxed. Note that "different in density of conductive material" means that the weight of conductive material per unit volume is different. For example, by increasing the number of dispersed particles of a conductive material per unit volume, or by using particles having a larger average particle diameter, an anisotropic conductive paste having a higher density of conductive material can be prepared.

In the connecting structure of the present invention, the connecting terminal (14) may be provided as a plurality of connecting terminals, the connector (21) may be provided as a plurality of connectors paired with the connecting terminals respectively, the bump (41) may be provided as a plurality of bumps which form a bump group and which connect the connecting terminals and the connectors respectively, and the bumps are mutually different in a diameter of the second member (43). Here, since the second member is formed of an anisotropic conductive paste which is different in density of conductive material from that of the first member, and has higher flexibility as compared to the case of being formed only of a conductive material, increase in diameter thereof to a certain degree does not impair flexibility as the entire bump. Therefore, by adjusting the diameter of the second member considering the degree of bending, positions of irregularities, and/or the like of the substrate according to a separation distance between the connecting terminal and the connector, reliability of connection can be assured.

In the connecting structure of the present invention, the first member (62) may be formed in a disc shape on the connecting terminal (14), and the second member (63) may be formed of a second anisotropic conductive paste (P2) which is lower in density of conductive material (M) than the first anisotropic conductive paste (P1) and formed to cover an upper surface (62A) and a side surface (62B) of the first member. In this case, the bump is formed of a portion where the first member and the second member overlap, and a portion formed only of the second member. Here, the first member is formed of the first anisotropic conductive paste, and the second member is formed of the second anisotropic conductive paste. Since the first anisotropic conductive paste is higher in density of conductive material than the second anisotropic conductive paste, the first member has higher conductivity than the second member. Therefore, the portion where the first member and the second member overlap has higher conductivity as compared to the portion formed only of the second member. Thus, in the portion where the first member and the second member overlap, conduction of the connecting terminal on the substrate and the connector on the electronic device can be assured, even when a weaker pressurizing force is applied, as compared to the portion formed only of the second member. Therefore, even when a distance between the connecting terminal and the connector is large and a sufficient compressive force cannot be given, the bump formed of the first member and the second member can assure electrical connection of the connecting terminal and the connector. Further, since both the first member and the second member are formed of anisotropic conductive pastes, the first member and the second member have more flexibility as compared to the bump formed only of the conductive material, and a stress applied to the bump can be relaxed.

In the connecting structure of the present invention, the second member (43) may have higher conductivity than the first member (42).

According to the present invention, there is provided a bump (15) which is used in the connecting structure of the present invention.

According to the present invention, there is provided a device-mounting substrate (1) which is formed by the connecting structure of the present invention. In this case, in the device-mounting substrate, without being affected by bending and/or irregularities of a substrate, it is possible to assure an electrical connection between the connecting terminal on the substrate and the connector on the electronic device.

According to a second aspect of the present invention, there is provided a connecting structure which electrically connects a plurality of connecting terminals (14) provided on a substrate (10) and a plurality of connectors (21) provided on an electronic device (20), the connecting structure including: a bump group formed of a plurality of bumps (51A, 51B, 51C, 51D) which connect the connecting terminals and the connectors paired with the connecting terminals respectively, wherein the bumps forming the bump group are formed of different anisotropic conductive pastes (PA, PB, PC, PD) from one another, the anisotropic conductive pastes containing particles of a conductive material (M); and density of the particles of the conductive material being different among the anisotropic conductive pastes.

According to this connecting structure, considering the degree of bending, positions of irregularities, and/or the like of the substrate, a reliability of connection can be assured by arranging the bump using the anisotropic conductive paste having a higher density of conductive material to a position where a separation distance between the connecting terminal and the connector is large.

According to the present invention, there is provided a device-mounting substrate (1) which is formed by the connecting structure of the present invention. In this case, in the device-mounting substrate, without being affected by bending and/or irregularities of a substrate, it is possible to assure an electrical connection between the connecting terminal on the substrate and the connector on the electronic device.

According to a third aspect of the present invention, there is provided a method for forming a bump (15) on a connecting terminal (14) provided on a surface of a substrate (10) to electrically connect the connecting terminal and a connector (21) which is provided on a surface of an electronic device (20) to be mounted on the substrate, the method including: a printing step (S101) for performing screen printing on the connecting terminal with an anisotropic conductive paste (P1) including particles of a conductive material (M); and a curing step (S102) for curing the anisotropic conductive paste after the printing. According to such a method, a bump formed of an anisotropic conductive paste can be easily formed.

The method for forming the bump of the present invention may further include: a through hole forming step (S103) for forming a through hole (18) penetrating through the cured anisotropic conductive paste (P1) to reach the connecting terminal (14); and a plating step (S104) for forming the conductive part (17) by filling the through hole with a conductive metal by electroplating using the connecting terminal as one of electrodes. This method is effective in the case where the connecting terminal or the connector can be used as one of electrodes for electroplating. Note that when a conductive film is provided on the bump, the conductive film may be formed simultaneously in the plating step, and after this plating step, a second plating step of depositing the conductive film on a surface of a base may be performed.

The method for forming the bump of the present invention may further include: a through hole forming step (S103) for forming a through hole (35) penetrating through the cured anisotropic conductive paste to reach the connecting terminal (14); and an electroless plating step (S114) for forming a conductive part (33) by filling the through hole with a conductive metal and for forming a conductive film (34) formed of the conductive metal on a surface (32A) of the anisotropic conductive paste, by electroless plating. This method is effective in the case where the connecting terminal or the connector cannot be used as an electrode for electroplating. Note that when a conductive film is provided on the bump, the conductive film may be formed simultaneously in the electroless plating step, and after this electroless plating step, a second plating step for depositing the conductive film on a surface of a base may be performed.

In the method for forming the bump of the present invention, in the printing step (S121), a base (42) may further be formed, and the base may be formed of the anisotropic conductive paste (P1) and may have a through hole (44) through the conductive paste reaching the connecting terminal (14); and the method may further include: a filling step (S123) for forming a through portion (43) by filling the through hole with a second anisotropic conductive paste (P2) which is different in density of conductive material (M) from the anisotropic conductive paste by screen printing; and a second curing step (S124) of curing the second anisotropic conductive paste after filling. According to such a method, since the base and the through portion are both formed by screen printing which is a simple and inexpensive method, the bump can be formed at a low cost.

In the method for forming bump of the present invention, the connecting terminal (14) is provided as a plurality of connecting terminals on the surface of the substrate (10) and the connector (21) is provided as a plurality of connectors on the surface of the electronic device (20); and the anisotropic conductive paste is provided as a plurality of anisotropic conductive pastes (PA, PB, PC, PD) containing particles of a conductive material, in the printing step (S131), density of the particles of the conductive material being different among the anisotropic conductive pastes printed on the connecting terminals respectively. By such a method, since a plurality of kinds of bumps having different conductivity can be formed easily, producing steps can be simplified and costs can be decreased.

The method for forming the bump of the present invention may further include: a second printing step (S143) for printing, by screen printing, a second anisotropic conductive paste (P2) which is different in density of conductive material (M) from the anisotropic conductive paste (P1) printed in the printing step (S141); and a second curing step (S144) for curing the second anisotropic conductive paste. In this case, the bump can be formed by screen printing and curing, which is a simple and inexpensive method.

According to the present invention, there is provided a method for producing a device-mounting substrate (1) in which an electronic device (20) is mounted on a substrate (10) thereof, the method including: a substrate providing step (S101 to S104) for providing the substrate which has a bump (15) formed by the method for forming the bump of the present invention; a positioning step (S201) for positioning an electronic device on the substrate so that the connecting terminal (14) and the connector (21) face each other with the bump being sandwiched therebetween; and a joining step (S202) for pressing the electronic device against the substrate to join the electronic device onto the substrate. According to this method, it is possible to produce a device-mounting substrate in which electrical connection between the connecting terminal on the substrate and the connector on the electronic device is assured without being affected by bending and/or irregularities of the substrate.

DETAILED DESCRIPTION OF THE PREFERRED EMBODIMENTS

Figure 1:
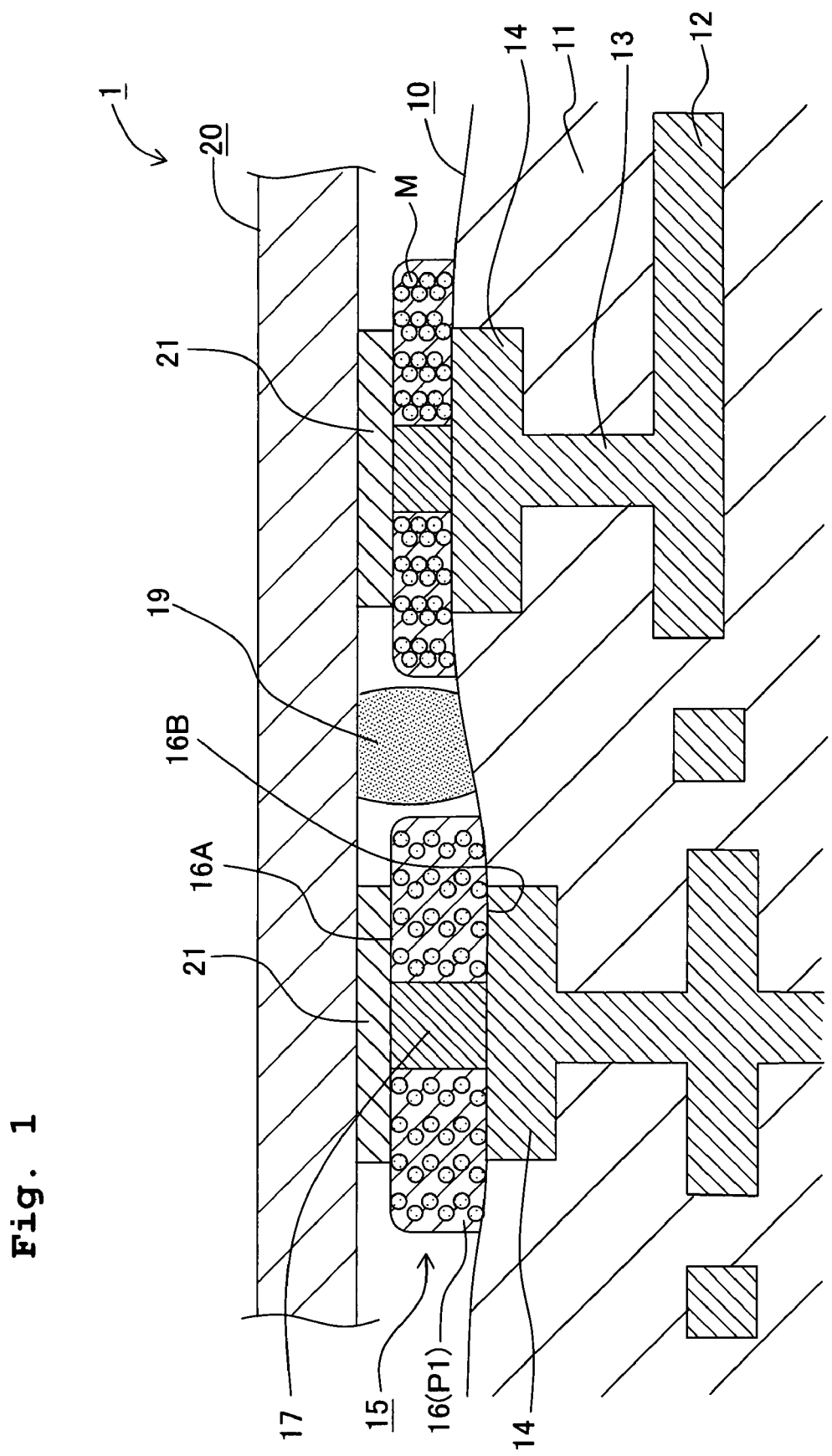
FIG. 1 is a partially enlarged cross-sectional view of a circuit substrate of a first embodiment.

Hereinafter, a first embodiment embodying the present invention will be explained in detail with reference to FIG. 1 to FIG. 5B. FIG. 1 shows a partially enlarged cross-sectional view of a circuit substrate 1 (device-mounting substrate) of this embodiment. The circuit substrate 1 is a substrate on which an LSI package 20 (electronic device) is mounted on a ceramic wiring board 10 (substrate).

Figure 2A:
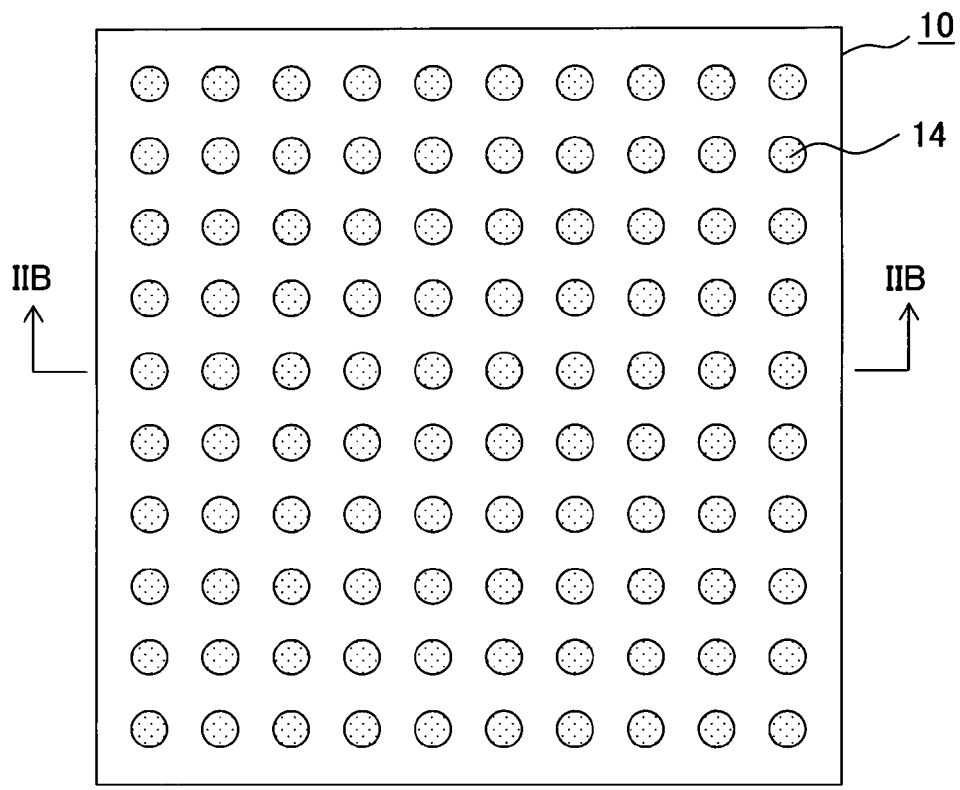
FIG. 2A is a top view of a ceramic wiring board.
Figure 2B:
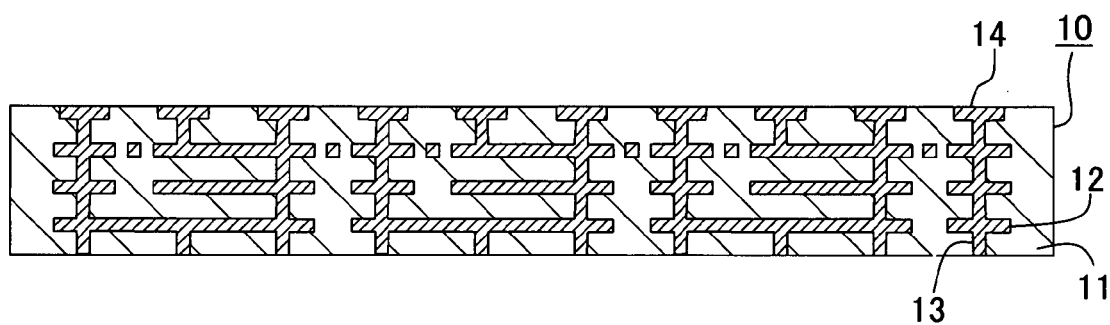
FIG. 2B is a cross-sectional view taken along the line IIB-IIB in FIG. 2A.

The ceramic wiring board 10 is a multilayer board of a well-known structure in which insulating layers 11 made of ceramics and conductive layers 12 each forming a predetermined pattern are stacked alternately, and the conductive layers are connected by via holes 13. FIG. 2A shows a top view of the ceramic wiring board 10 and FIG. 2B shows a cross-sectional view of the ceramic wiring board 10. A portion of the conductive layer 12 formed on an upper surface (surface on a side where the LSI package 20 is mounted) of the ceramic wiring board 10 is designated as a substrate-side pad 14 (connecting terminal). There is provided a plurality of substrate-side pads 14 arranged in a matrix corresponding to bump pads 21 of the LSI package 20 (or a LSI chip, a semiconductor device), which will be described later.

On the other hand, on a lower surface side of the LSI package 20 mounted on the ceramic wiring board 10, a plurality of bump pads 21 (connector) arranged in a matrix are formed. As shown in FIG. 1, the bump pads 21 of the LSI package 20 and the substrate-side pads 14 of the ceramic wiring board 10 corresponding thereto are connected via bumps 15 respectively.

The bumps 15 are each formed of a base 16 (first member) formed in a substantially disk shape by an anisotropic conductive paste (ACP) P1 and a conductive part 17 (second member) penetrating through the base 16 in a vertical direction (the direction along a stacking direction of the ceramic wiring board 10 and the LSI package 20). The anisotropic conductive paste P1 forming the base 16 is made by dispersing particles M of a conductive material such as nickel in a binder formed of thermoset resin such as cold curing type resin for example. In this anisotropic conductive paste P1, when being compressed appropriately between the bump pads 21 and the substrate-side pads 14, the particles M of a conductive material contact each other to form a conductive path, thereby giving conductivity in a pressurizing direction.

On the other hand, the conductive part 17 is formed of a conductive material such as metal for example in a thin wire form which is slender in a vertical direction, and is arranged at the center of a circle of the base 16 when viewed from an upper side. Then, one end (upper end) thereof is exposed in the base 16 on a connecting surface 16A for a bump pad 21 and makes contact with the bump pad 21, and the other end (lower end) thereof is exposed in the base 16 on a connecting surface 16B for a substrate-side pad 14 and makes contact with the substrate-side pad 14. Also by this conductive part 17, electrical connection between the bump pad 21 and the substrate-side pad 14 is made.

Note that for the conductive part 17, it is preferable to use conductive material that is as soft as possible (gold for example) so as not to impair compressibility of the bump 15 between the bump pad 21 and the substrate-side pad 14. Further, from a similar viewpoint, it is preferable that the conductive part 17 is as small as possible in diameter in the range capable of assuring conductivity. For example, when gold is used as the conductive material, it is preferable that the diameter thereof is not more than 7.5 μm.

Figure 22:
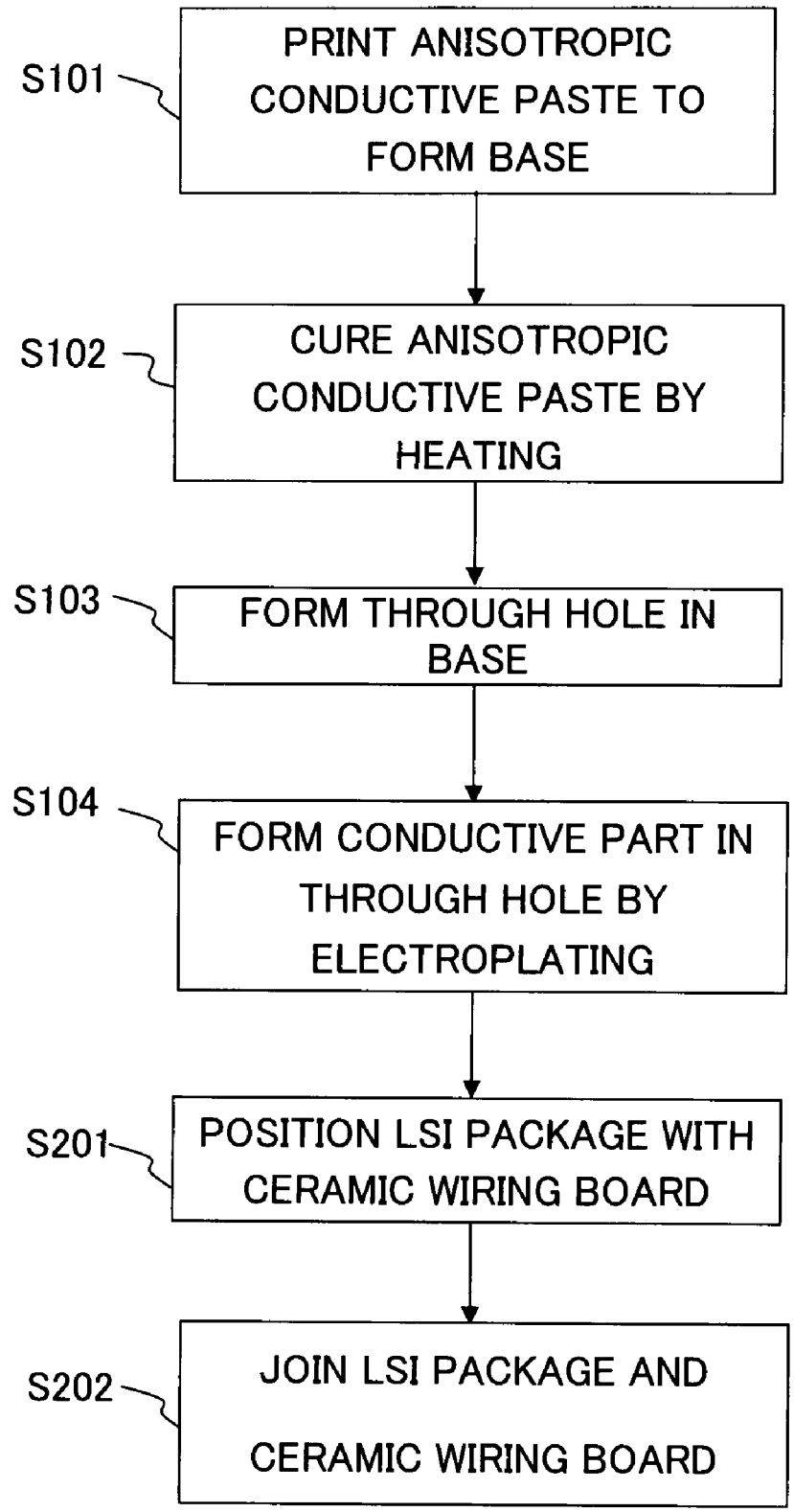
FIG. 22 is a flowchart showing procedures of a method for forming bumps and a method for connecting an LSI package and a ceramic wiring board in the first embodiment.

Next, a method for forming the bumps 15 and a method for connecting the bump pads 21 and the corresponding substrate-side pads 14 by the bumps 15 will be explained with reference to the flowchart in FIG. 22.

Figure 3A:
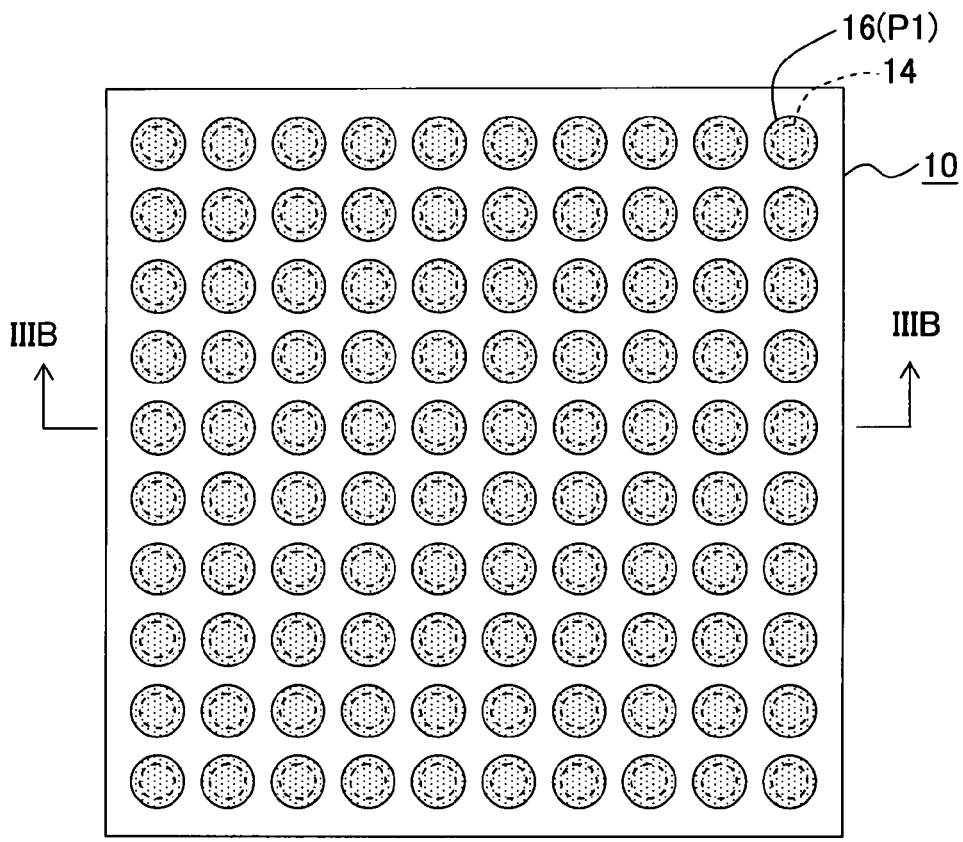
FIG. 3A is a top view showing a state that an anisotropic conductive paste is printed on substrate-side pads of the ceramic wiring board by a screen printing method.
Figure 3B:
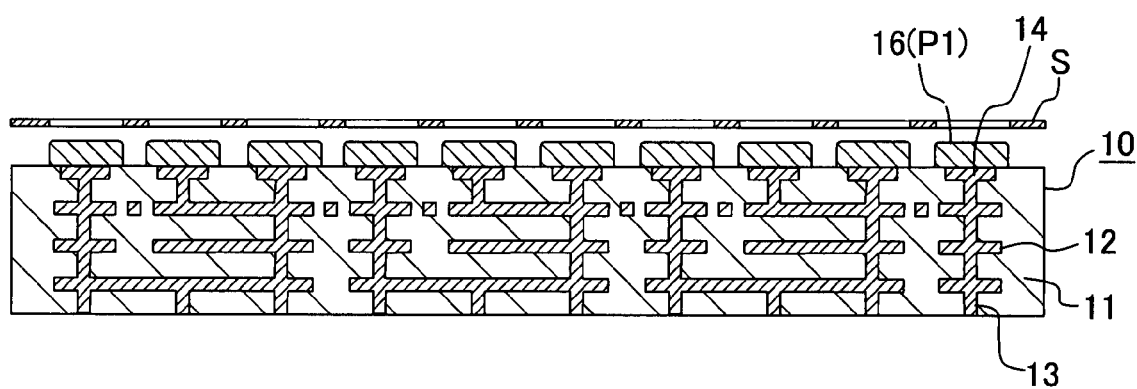
FIG. 3B is a cross-sectional view taken along the line IIIB-IIIB in FIG. 3A.

First, on each of the substrate-side pads 14 of the ceramic wiring board 10, the anisotropic conductive paste P1 is printed by a screen printing method to thereby form the bases 16 of the bumps 15 (step S101: printing step). FIG. 3A shows a top view showing a state that the anisotropic conductive paste P1 is printed on the substrate-side pads 14 by a screen printing method, and FIG. 3B shows a cross-section thereof (note that in FIG. 3A a screen S is omitted). After the printing is completed, the anisotropic conductive paste P1 is cured by heating (step S102: curing step).

Figure 4A:
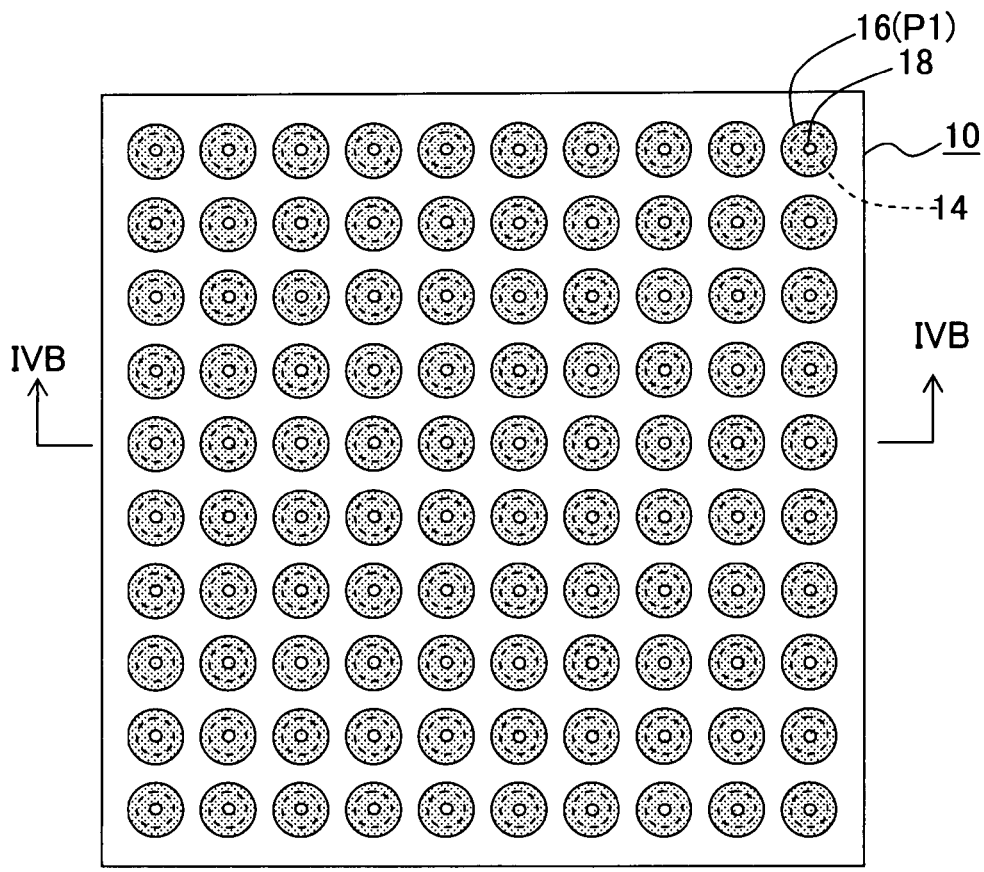
FIG. 4A is a top view showing a state that through holes reaching from upper surfaces of bases to surfaces of the substrate-side pads are formed.
Figure 4B:
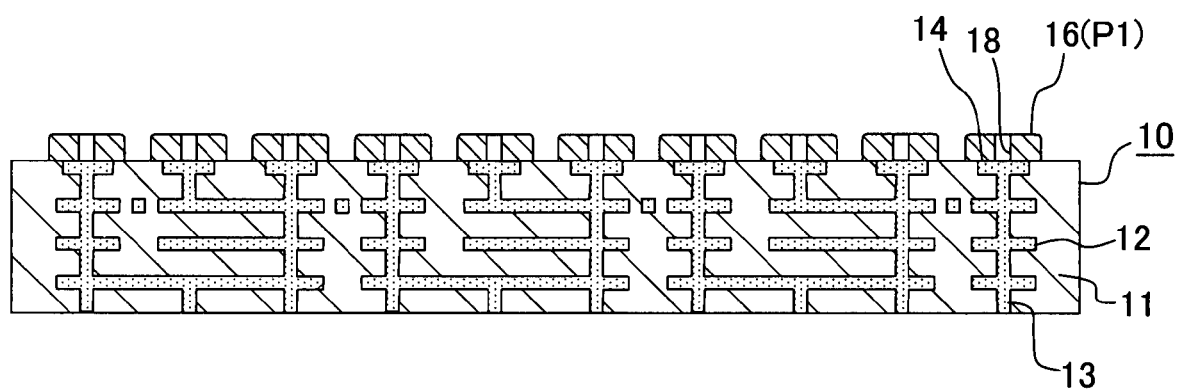
FIG. 4B is a cross-sectional view taken along the line IVB-IVB in FIG. 4A.

Next, laser irradiation is performed from upper surface side (side to contact the bump pads 21) of the bases 16, and thereby through holes 18, which reach surfaces of the substrate-side pads 14, are formed respectively at centers of the bases 16 when viewed from an upper surface of the bases 16 (step S103: through hole forming step; see FIG. 4A and FIG. 4B).

Figure 5A:
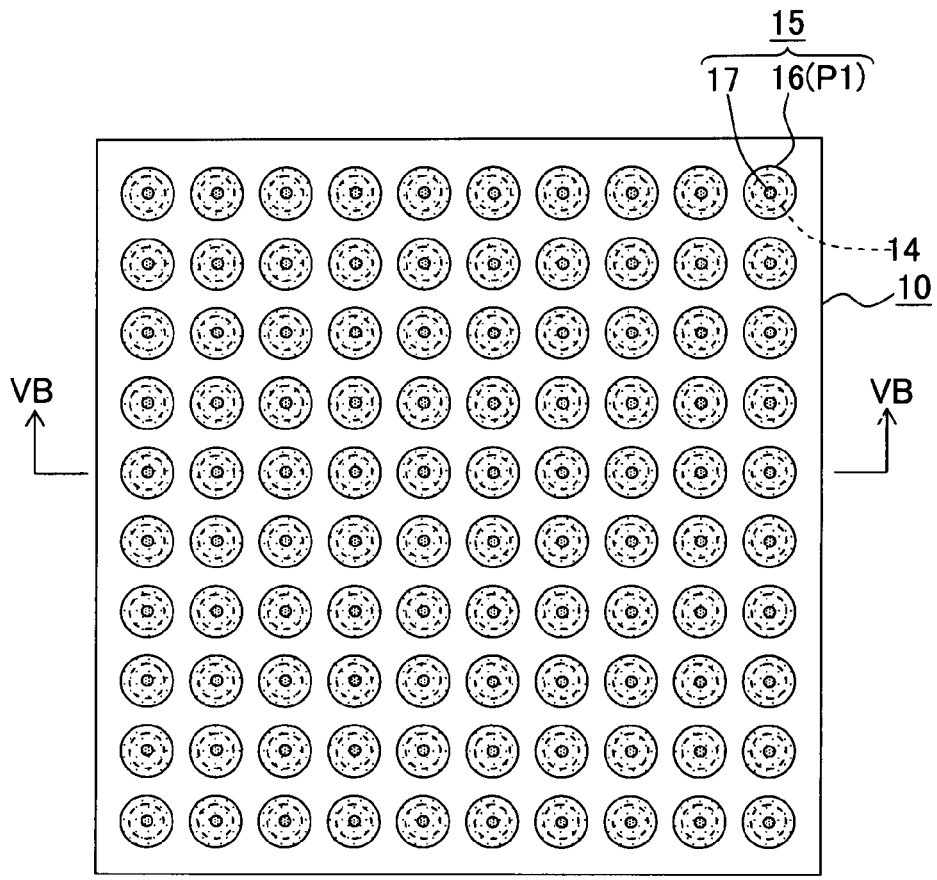
FIG. 5A is a top view showing a state that conductive parts are formed by filling the through holes with metal.
Figure 5B:
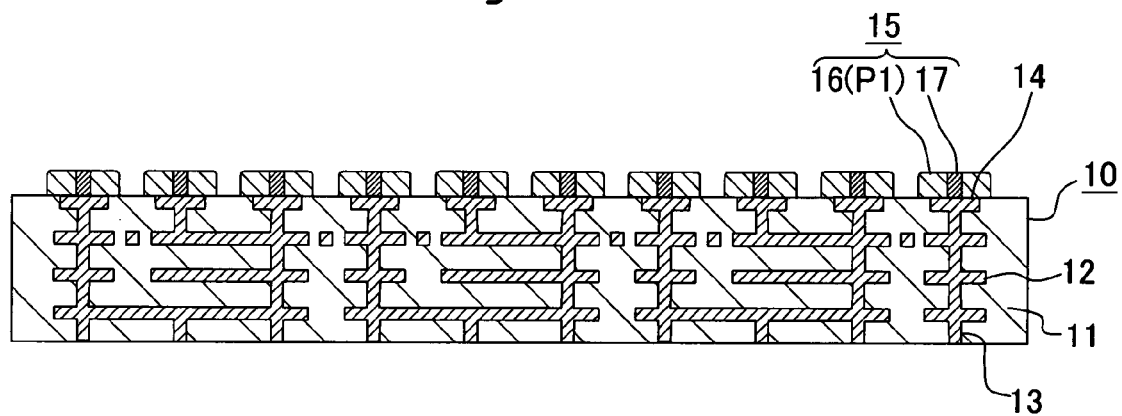
FIG. 5B is a cross-sectional view taken along the line VB-VB in FIG. 5A.

Then, electroplating is performed using the substrate-side pads 14 as one of electrodes, thereby the through holes 18 are filled with metal so as to form the conductive parts 17 (step S104: plating step; see FIG. 5A and FIG. 5B). In this embodiment, since all the substrate-side pads 14 conduct to the lower surface side of the ceramic wiring board 10 through via holes 13 and conductive layers 12 as internal layers (see FIG. 5B), the substrate-side pads 14 can be used as one of electrodes during electroplating. Note that the filling amount of the metal is preferably an amount by which the metal is substantially leveled with surfaces of the bases 16.

Each of the formed conductive parts 17 has one end (lower end) contacting one of the substrate-side pads 14, and the other end (upper end) exposed on the connecting surface 16A for one of the bump pads 21. Note that when copper is used as the plating metal, it is preferable that a protective film such as Ni/Au is formed on an upper end surface of each of the conductive parts 17 after the filling is finished in order to prevent oxidation. Such a protective film can be formed by electroless plating for example. In this manner, the bumps 15 are formed respectively on the substrate-side pads 14 of the ceramics wiring board 10 (steps S101-S104: substrate providing step).

Next, a procedure of mounting the LSI package 20 on the ceramic wiring board 10 on which the bumps 15 are formed will be described.

First, adhesive 19 is applied on the upper surface of the ceramic wiring board 10. Next, the LSI package 20 is mounted on the ceramic wiring board 10 while being positioned so that the bumps 15 formed on the substrate-side pads 14 match with the bump pads 21 corresponding thereto (step S201: positioning step). Next, by thermal pressing or the like, the LSI package 20 is heated while being pressed against the ceramic wiring board 10 so as to cure the adhesive 19, thereby joining the ceramic wiring board 10 and the LSI package 20 (step S202: joining step). In other words, the LSI package 20 is fixed to the ceramic wiring board 10 at a position where the LSI package 20 is pressed against the ceramic wiring board 10. At this time, the anisotropic conductive pastes P1 forming the bases 16 of the bumps 15 are compressed between the bump pads 21 and the substrate-side pads 14, and thereby conductivity in the pressurizing direction is given. Accordingly, the substrate-side pads 14 and the bump pads 21 are connected electrically (see FIG. 1). At the same time, upper ends of the conductive parts 17 contact the bump pads 21, and also by these conductive parts 17, the substrate-side pads 14 and the bump pads 21 are connected electrically.

As described above, according to this embodiment, the substrate-side pads 14 provided on the ceramic wiring board 10 and the bump pads 21 provided on the LSI package 20 are connected respectively by the bumps 15 formed of the anisotropic conductive paste P1. With such a structure, the bumps 15 formed of the anisotropic conductive paste P1 is more excellent in flexibility as compared to solder bumps, and thus the stress applied to interfaces between the bumps 15 and the substrate-side pads 14 is relaxed. Therefore, it is possible to assure reliability of connection even when using the ceramic wiring board 10 with large surface irregularities and/or bending, which has relatively higher possibility of generating stress at the connecting portion between one of the bumps 15 and one of the substrate-side pads 14.

Further, being different from the case of using an anisotropic conductive film, the conductive material does not exist in regions other than positions where the substrate-side pads 14 and the bump pads 21 are provided. Therefore, short-circuit or the like does not occur, and thus the insulation characteristics between adjacent substrate-side pads 14 and bump pads 21 is maintained.

Further, when bending and/or surface irregularities of the ceramic wiring board 10 are large, dispersion in distances between the substrate-side pads 14 and the bump pads 21 generates dispersion in pressurizing forces to the bumps 15. In particular, a sufficient compressive force is not applied to the bump 15 existing at a position where the distance between one of the substrate-side pads 14 and one of the bump pads 21 is large (see the bump 15 on the left side in FIG. 1), thereby causing a situation such that conduction is not assured sufficiently. However, in this embodiment, since the conductive parts 17 are provided in the respective bumps 15, these conductive parts 17 assure electrical connections between the substrate-side pads 14 and the bump pads 21 regardless of the strength/weakness of the pressurizing force to the bumps 15. Thus, electrical connections between the substrate-side pads 14 and the bump pads 21 can be assured.

Further, the conductive parts 17 are formed of soft conductive materials, and are made as thin as possible in the range capable of assuring conduction. With such a structure, it is possible to avoid conduction failure due to disturbing of compression of the anisotropic conductive paste P1. Furthermore, it is possible to avoid situations such that the stress relaxation effect is impaired and hence a crack is made easily, the conductive part 17 is broken by compression of the bump 15 and hence conduction cannot be assured, and/or the like.

Second Embodiment

Hereinafter, a second embodiment of the present invention will be explained with reference to FIG. 6 to FIG. 8B. The main difference of this embodiment from the first embodiment is that each of bumps 31 is provided with a conductive film 34. Note that the same structures as in the first embodiment are designated the same reference numerals, and explanations of which are omitted.

Figure 6:
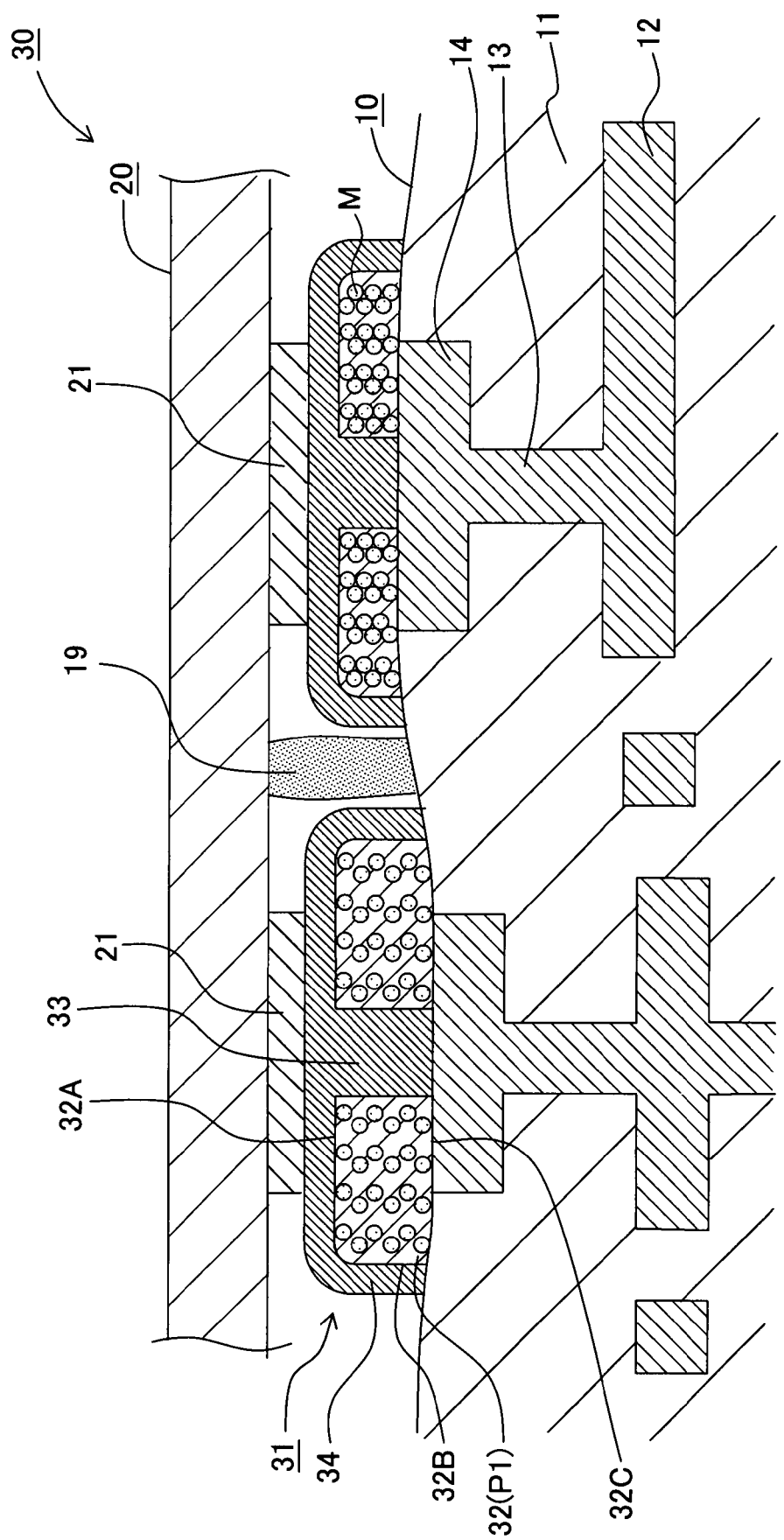
FIG. 6 is a partially enlarged cross-sectional view of a circuit substrate of a second embodiment.

Also in a circuit substrate 30 of this embodiment, bump pads 21 on the LSI package 20 and corresponding substrate-side pads 14 on the ceramic wiring board 10 are connected via the bumps 31 respectively (see FIG. 6). Each of the bumps 31 is formed of a base 32 (first member) formed of an anisotropic conductive paste P1, a conductive part 33 (second member) penetrating through the base 32 in a vertical direction, and a conductive film 34 covering the surface of the base 32. The structures of the base 32 and the conductive part 33 are the same as in the first embodiment.

The conductive film 34 is formed of a conductive material such as metal for example, and is formed entirely on an upper surface 32A and a side surface 32B of the base 32. Namely, the conductive film 34 is formed in a thin film form covering the connecting surface 32A for the bump pad 21 and the exposed surface 32B not in contact with either the ceramic wiring board 10 or the LSI package 20. Further, the conductive part 33 is in contact with this conductive film 34 on a lower surface, and thereby the conductive part 33 and the conductive film 34 are connected electrically. It is preferable that this conductive film 34 is formed in a thin film using a soft conductive material so that the compressibility of the bump 31 is not impaired. However, when an effect to improve durability of the bump 31 by covering the exposed surface of the base 32 is expected together, it is preferable that the conductive film 34 has stiffness and a thickness to the extent that the compressibility of the bump 31 is not impaired.

Figure 23:
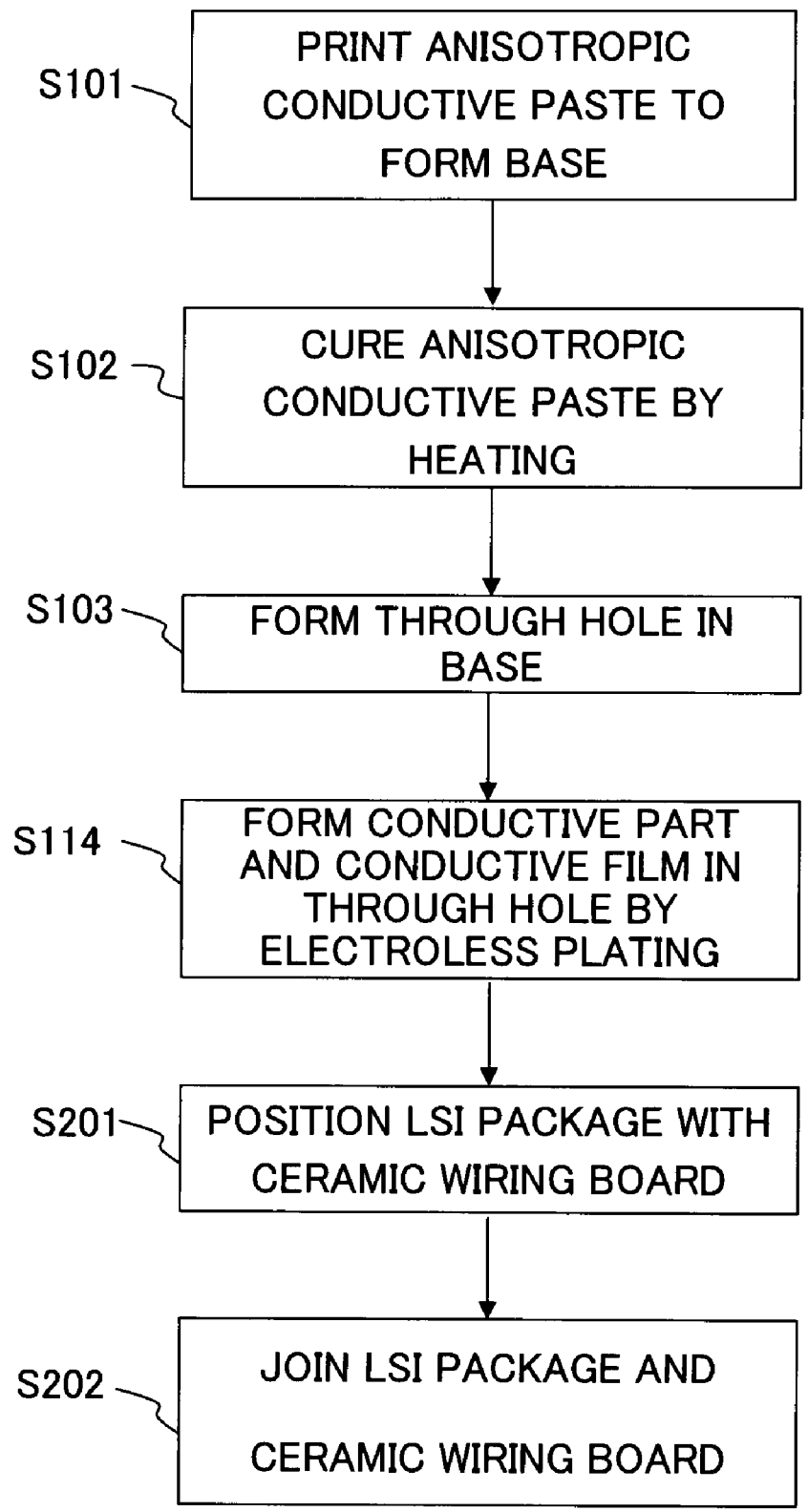
FIG. 23 is a flowchart showing procedures of a method for forming bumps and a method for connecting an LSI package and a ceramic wiring board in the second embodiment.

Next, a method for forming the bumps 31 and a method for connecting the bump pads 21 and the corresponding substrate-side pads 14 by the bumps 31 will be explained with reference to the flowchart in FIG. 23.

Figure 7A:
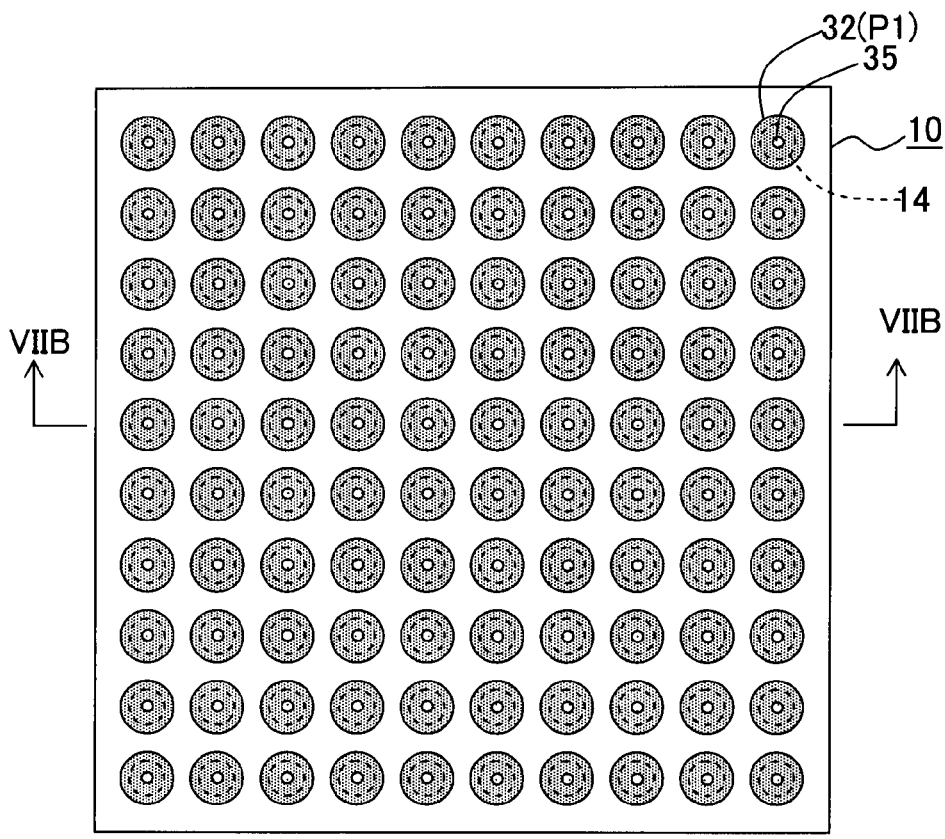
FIG. 7A is a top view showing a state that an anisotropic conductive paste is printed on substrate-side pads of a ceramic wiring board by a screen printing method, and through holes reaching from upper surfaces of bases to surfaces of the substrate-side pads are formed.
Figure 7B:
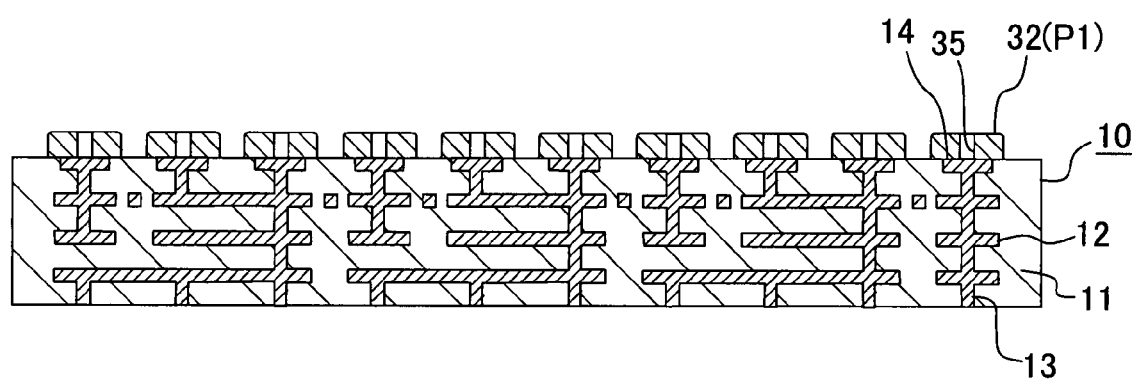
FIG. 7B is a cross-sectional view taken along the line VIIB-VIIB in FIG. 7A.

First, a printing step (step S101), a curing step (step S102), and a through hole forming step (step S103) are performed to form bases 32 having through holes 35 respectively on the substrate-side pads 14 of the ceramic wiring board 10 (see FIG. 7A, FIG. 7B). The printing step, curing step and through hole forming step are the same as those in the first embodiment, and therefore detailed descriptions thereof are omitted.

Figure 8A:
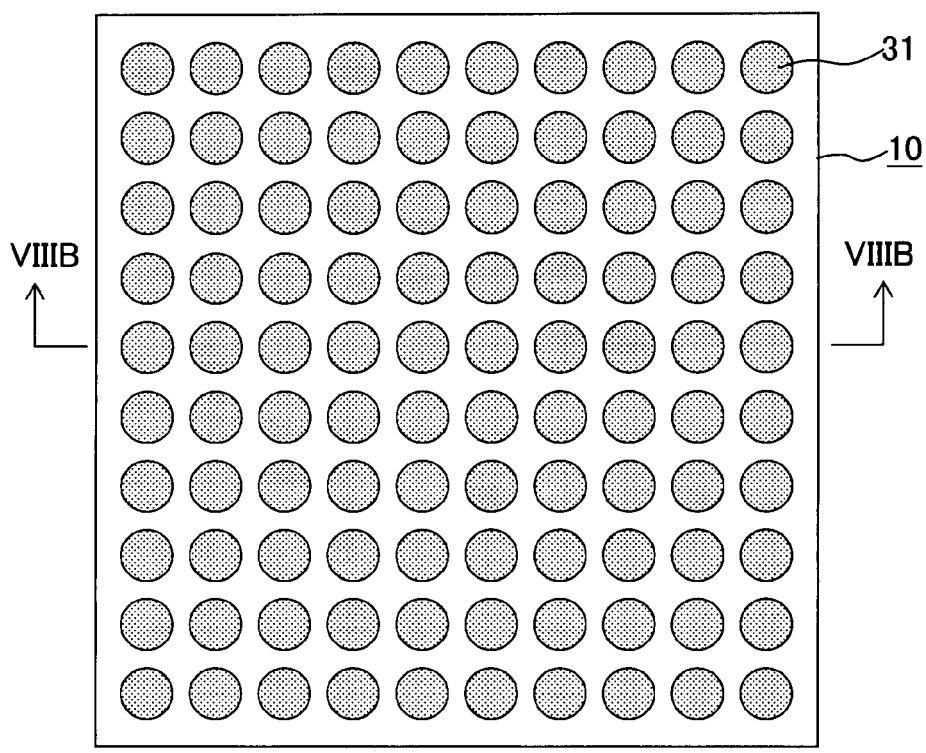
FIG. 8A is a top view showing a state that metal is filled in the through holes to form conductive parts, and conductive films are formed on surfaces of the bases.
Figure 8B:
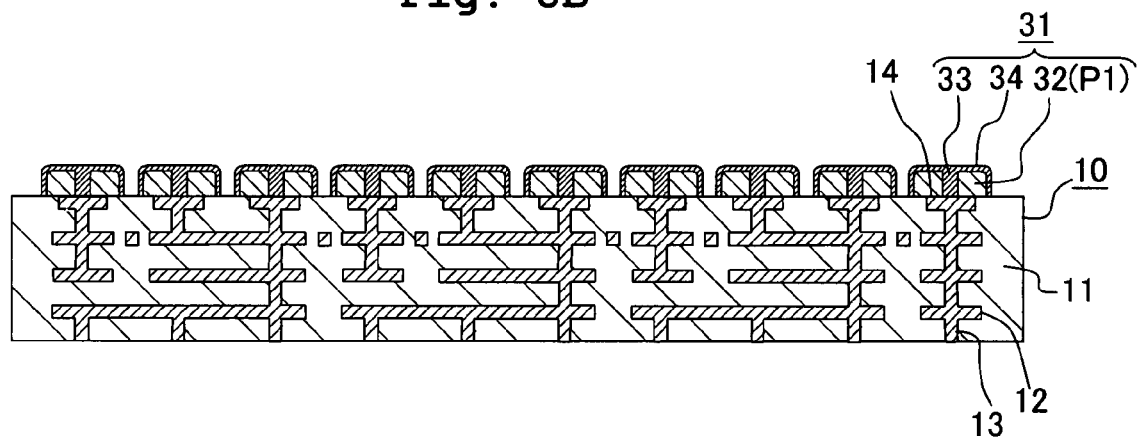
FIG. 8B is a cross-sectional view taken along the line VIIIB-VIIIB in FIG. 8A.

Next, by electroless plating, metal is filled in the through holes 35 to form conductive parts 33, and the conductive film 34 is entirely formed on the upper surface and side surface of each of the bases 32 (step S114: electroless plating step; see FIG. 8A, FIG. 8B). In this embodiment, being different from the first embodiment, since not all of the substrate-side pads 14 conduct to the via holes 13 and the lower surface of the ceramic wiring board 10 as an inner layer (see FIG. 8B), it is not easy to use the substrate-side pads 14 as one of electrodes during plating. Therefore, electroless plating is suitable as the method for forming the conductive parts 33 and the conductive films 34.

When the bumps 31 are formed on the substrate-side pads 14 in this manner, the LSI package 20 is mounted on the ceramic wiring board 10 similarly to the first embodiment (step S201: positioning step; step S202: joining step). At this time, similarly to the first embodiment, the anisotropic conductive pastes P1 forming the bases 32 of the bumps 31 are compressed between the bump pads 21 and the substrate-side pads 14, and thereby conductivity is given in a pressurizing direction. Thus, the substrate-side pads 14 and the bump pads 21 are connected electrically. At the same time, upper ends of the conductive parts 33 contact the bump pads 21 via the conductive films 34, and also by these conductive parts 33 and the conductive films 34, the substrate-side pads 14 and the bump pads 21 are connected electrically.

Here, in the case where the bumps 31 are formed on the substrate-side pads 14 and the LSI package 20 is mounted thereafter as in this embodiment, it is concerned that if the positional accuracy of the substrate-side pads 14 of the ceramic wiring board 10 and the bump pads 21 of the LSI package 20 is not so high, the conductive parts 33 may be displaced from the bump pads 21, and thus electrical connections between the substrate-side pads 14 and the bump pads 21 cannot be assured. However, in this embodiment, since the conductive films 34 are provided on the bumps 31, these conductive films 34 contact the bump pads 21 in a surface-to-surface manner. Thus, the bump pads 21 and the conductive parts 33 conduct via the conductive films 34, and eventually the conduction of the substrate-side pads 14 with the bump pads 21 is assured.

Moreover, on the bases 32, the conductive films 34 cover not only the connecting surfaces 32A for the bump pads 21 but also the entire exposed surfaces 32B. In this manner, by covering and protecting the exposed surfaces 32B of the bases 32 by the conductive films 34, the bumps 31 can be given abrasion resistance, thereby improving the durability.

As described above, also in this embodiment, since the substrate-side pads 14 and the bump pads 21 are connected by the bumps 31 formed of the anisotropic conductive paste P1, and moreover the conductive parts 33 are provided on the bumps 31, the same operation and effect as in the first embodiment can be provided. Furthermore, since the conductive films 34 are provided on the bumps 31 and these conductive films 34 contact the bump pads 21 in a surface-to-surface manner, conduction between the substrate-side pads 14 and the bump pads 21 can be assured even when the positional accuracy between the substrate-side pads 14 and the bump pads 21 is not so high.

Third Embodiment

Hereinafter, a third embodiment of the present invention will be described with reference to FIG. 9 to FIG. 11B. The main difference of this embodiment from the first embodiment is that each of bumps 41 is formed of a base 42 (first member) formed of a first anisotropic conductive paste P1 and a high density part 43 (second member, through part) formed of a second anisotropic conductive paste P2 which is higher in density of conductive material than the first anisotropic conductive paste P1. In other words, the high density part 43 has higher conductivity than the base 42. Note that the same structures as in the first embodiment are designated the same reference numerals, and explanations thereof are omitted.

Figure 9:
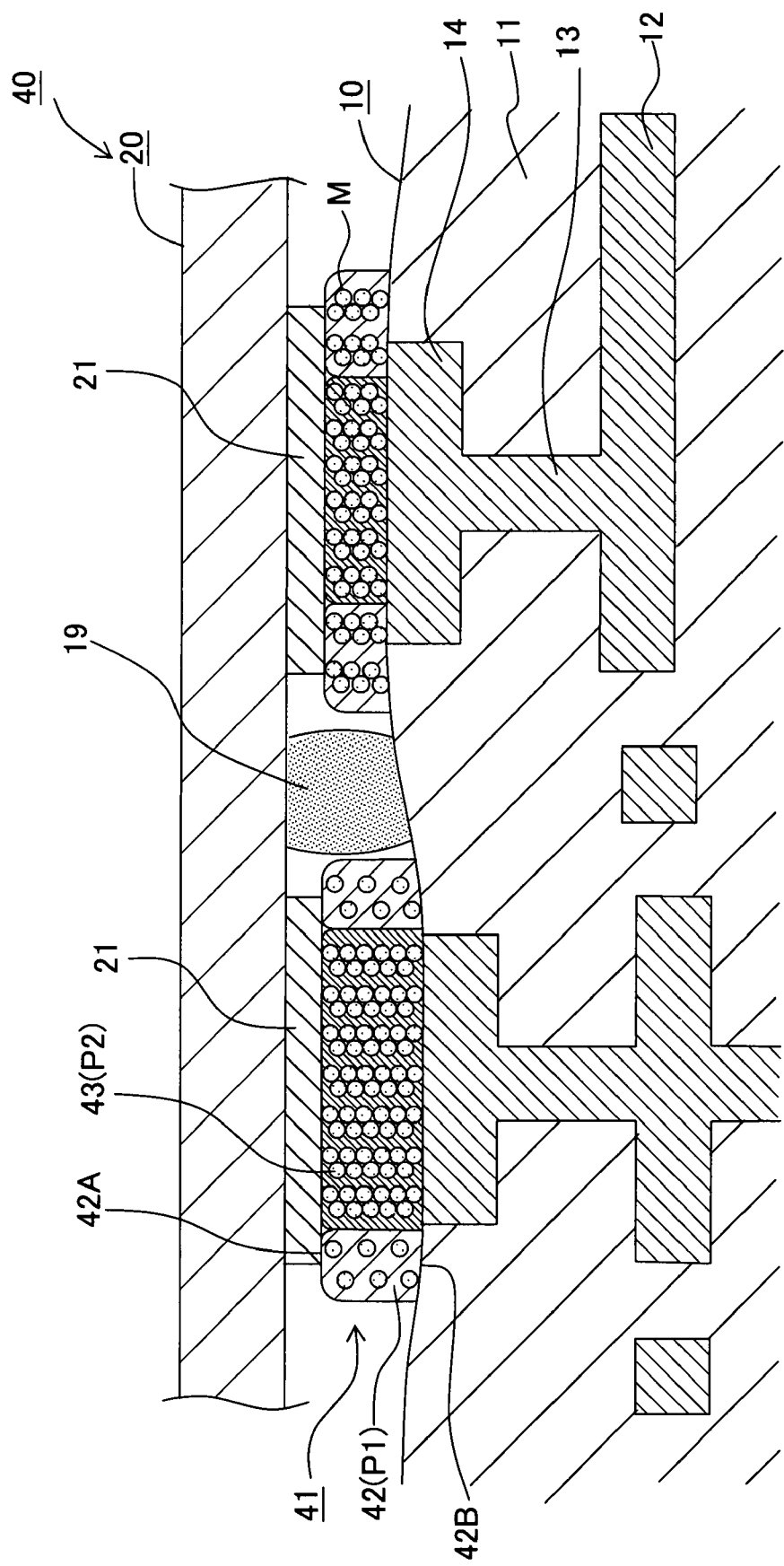
FIG. 9 is a partially enlarged cross-sectional view of a circuit substrate of a third embodiment.

Also in a circuit substrate 40 of this embodiment, bump pads 21 of the LSI package 20 and corresponding substrate-side pads 14 of the ceramic wiring board 10 are connected via the bumps 41 respectively (see FIG. 9).

Each of the bumps 41 has a base 42 (first member) and a high density part 43 (second member) penetrating through the base 42 in a vertical direction (in the stacking direction of the ceramic wiring board 10 and the LSI package 20). The base 42 is formed in a substantially ring shape by the first anisotropic conductive paste P1.

On the other hand, the high density part 43 is formed by the second anisotropic conductive paste P2 in a disk shape having a diameter equal to the inner diameter of a ring of the base 42, and is accommodated inside the ring of the base 42. Then, one end (upper end) thereof is exposed on a connecting surface 42A for a bump pad 21 on the base 42 and contacts the bump pad 21, and the other end (lower end) thereof is exposed on a connecting surface 42B for a substrate-side pad 14 on the base 42 and contacts the substrate-side pad 14.

The second anisotropic conductive paste P2 forming the high density part 43 is higher in density of conductive material than the first anisotropic conductive paste P1 forming the base 42. Namely, the second anisotropic conductive paste P2 has higher conductivity than the first anisotropic conductive paste P1. Here, "higher in density of conductive material" means that the weight of the conductive material per unit volume is larger. To prepare the anisotropic conductive paste having a higher density of conductive material, it is conceivable, for example, to increase the number of particles of a conductive material M dispersed in resin per unit volume, or use particles having a large mean particle diameter. Materials of the resin and the conductive material forming the two kinds of anisotropic conductive pastes P1, P2 may be the same as or different from each other.

The base 42 and the high density part 43 are both given conductivity in a pressurizing direction by being compressed appropriately between the bump pad 21 and the substrate-side pad 14, and thereby the bump pad 21 and the substrate-side pad 14 are connected electrically. Note that since the high density part 43 is formed of the anisotropic conductive paste P2 which is higher in density of conductive material as compared to the base part 42, conductivity is assured by a weaker pressurizing force.

Figure 24:
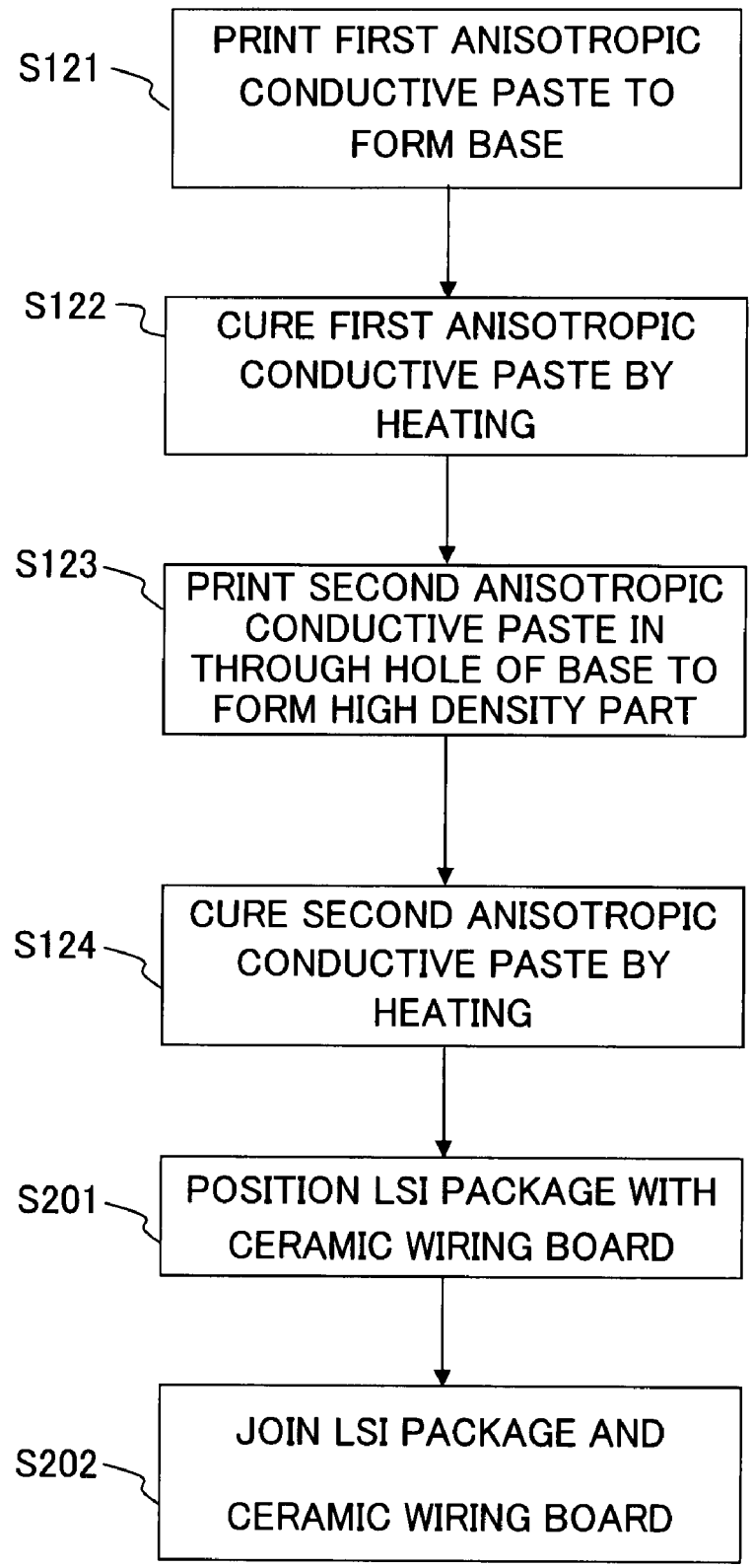
FIG. 24 is a flowchart showing procedures of a method for forming bumps and a method for connecting an LSI package and a ceramic wiring board in the third embodiment.

Next, a method for forming the bumps 41 and a method for connecting the bump pads 21 and the corresponding substrate-side pads 14 by the bumps 41 will be explained with reference to the flowchart in FIG. 24.

Figure 10A:
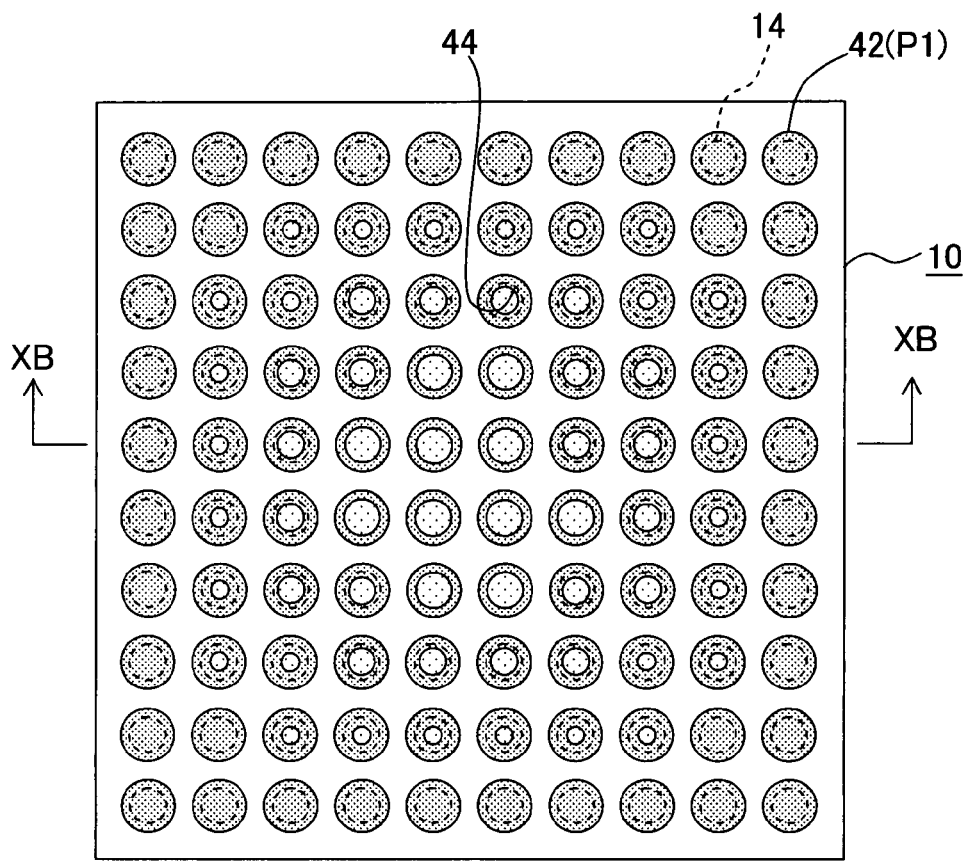
FIG. 10A is a top view showing a state that a first anisotropic conductive paste is printed on substrate-side pads of a ceramic wiring board by a screen printing method to form bases.
Figure 10B:
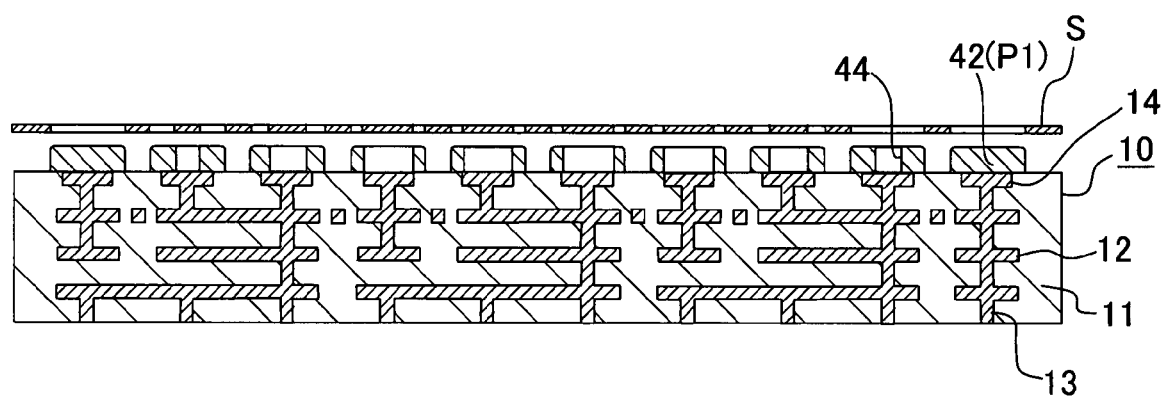
FIG. 10B is a cross-sectional view taken along the line XB-XB in FIG. 10A.

First, on the substrate-side pads 14 of the ceramic wiring board 10, the first anisotropic conductive paste P1 is printed by a screen printing method to thereby form the bases 42 of the bumps 15 (Step S121: printing step; see FIG. 10A, FIG. 10B). At this time, on part of the substrate-side pads 14, the bases 42 are formed having through holes 44 penetrating through the bases 42 in a vertical direction. In this embodiment, the anisotropic conductive paste P1 is printed in a disc shape on each of part of the substrate-side pads 14 located in a peripheral portion of the ceramic wiring board 10 when viewed from an upper surface of the ceramic wiring board 10 (mounting surface for the LSI package 20), thereby forming bases 42 which do not have through holes 44. On the other hand, the anisotropic conductive paste P1 is printed in a ring shape on each of the other substrate-side pads 14 located more inside than the above substrate-side pads 14, thereby forming bases 42 which have through holes 44. Note that the bases 42 formed on the substrate-side pads 14 located at positions closer to the center of the ceramic wiring board 10 have the through holes 44 with larger diameters. After the printing is completed, the anisotropic conductive paste P1 is cured by heating (step S122: curing step).

Figure 11A:
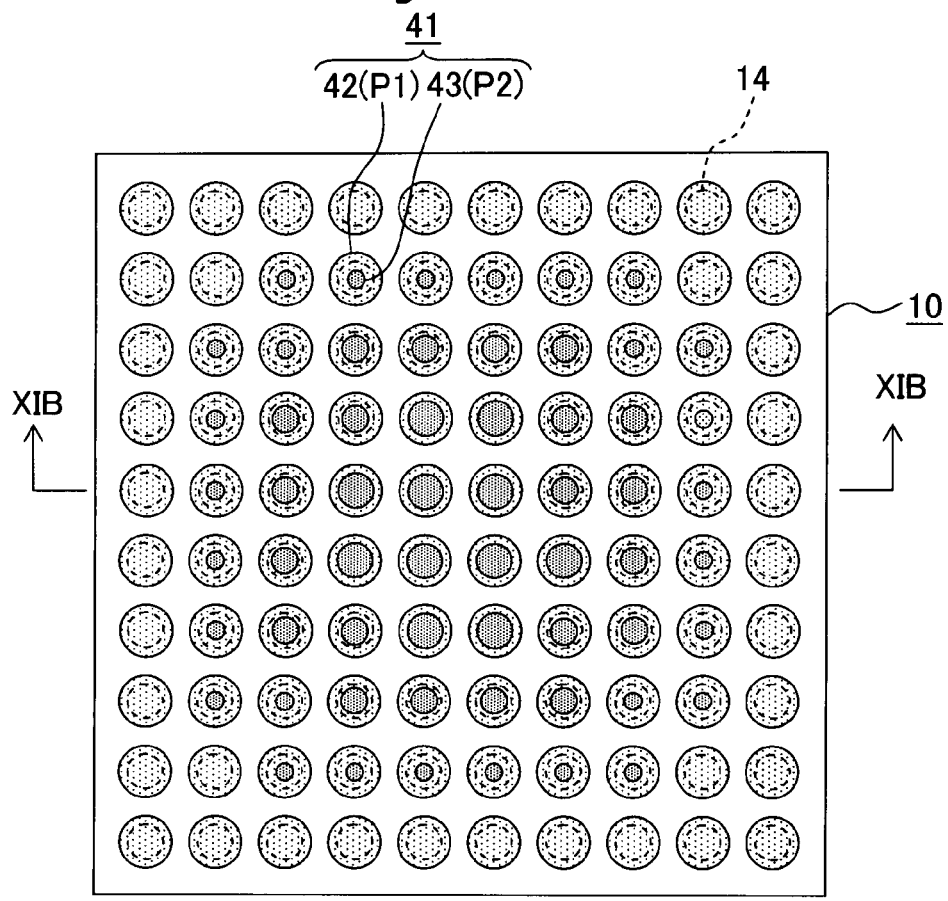
FIG. 11A is a top view showing a state that a second anisotropic conductive paste is filled in the through holes by a screen printing method to form high density portions.
Figure 11B:
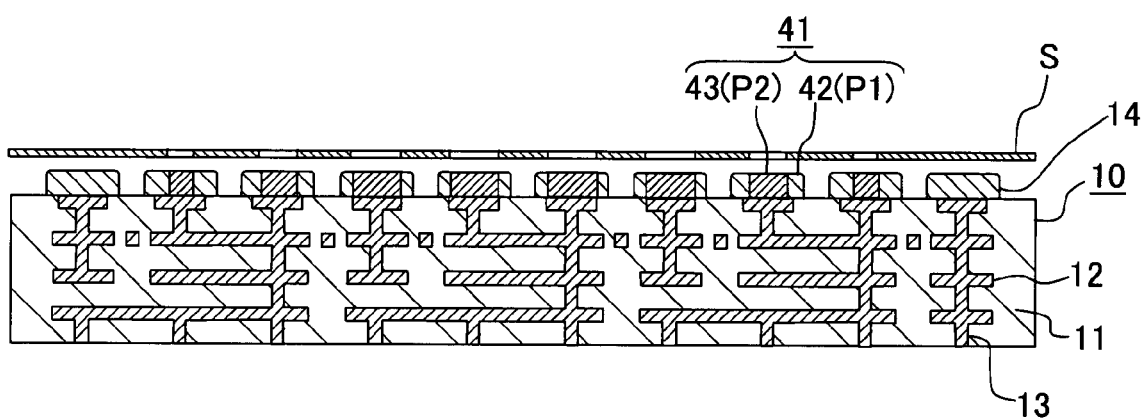
FIG. 11B is a cross-sectional view taken along the line XIB-XIB in FIG. 11A.

Next, inside the through holes 44, the second anisotropic conductive paste is filled by screen printing to form the high density parts 43 (through part) (step S123: filling step; see FIG. 11A, FIG. 11B). After the filling is completed, the second anisotropic conductive paste P2 is cured by heating (step S124: second curing step).

When the bumps 41 are formed on the substrate-side pads 14 in this manner, the LSI package 20 is mounted on the ceramic wiring board 10 similarly to the first embodiment (step S201: positioning step; step S202: joining step). At this time, the first anisotropic conductive pastes P1 forming the bases 42 of the bumps 41 and the second anisotropic conductive pastes P2 forming the high density parts 43 are compressed together between the bump pads 21 and the substrate-side pads 14, and thereby conductivity is given in the pressurizing direction. Thus, the substrate-side pads 14 and the bump pads 21 are connected electrically.

Here, when bending and/or surface irregularities of the ceramic wiring board 10 are large, dispersion in pressurizing forces to the bumps 41 occurs depending on distances between the substrate-side pads 14 and the bump pads 21. In particular, a sufficient compressive force is not applied to the bumps 41 formed at positions where the spacing distances between the substrate-side pads 14 and the bump pads 21 are large (refer to the bump 41 on the left side in FIG. 9), which may result in a situation such that the conduction is not assured sufficiently. However, in this embodiment, the high density parts 43 are provided in the bumps 41. Since the high density parts 43 are each formed of the second anisotropic conductive paste P2 having a relatively higher density of conductive material, conduction is assured even by a weaker pressurizing force. Accordingly, electrical connections between the substrate-side pads 14 and the bump pads 21 can be assured.

In particular, in this embodiment, the high density parts 43 are provided in the bumps 41 located on the center side of the ceramic wiring board 10 when viewed from the upper surface, and moreover, the bumps 41 arranged at positions closer to the center have the high density parts 43 with larger diameters. This structure is for taking into account that the ceramic wiring board 10 generally tends to bend with the upper surface thereof concave inward, and in regions closer to the center of the ceramic wiring board 10, distances between the substrate-side pads 14 and the bump pads 21 tend to be larger.

Namely, since the high density parts 43 are formed of the anisotropic conductive paste P2, and thus have higher flexibility as compared to the case of being formed only of conductive material, the flexibility as an entire bump 41 is not impaired even when the diameter thereof is made larger to the certain extent. Using this factor, by making the diameters of high density parts 43 larger in bumps 41 formed at positions where the spacing distances between the substrate-side pads 14 and the bump pads 21 are large, the reliability of connection can be assured further.

As described above, also in this embodiment, since the substrate-side pads 14 and the bump pads 21 are connected by the bumps 41 formed of the anisotropic conductive pastes P1, P2, the same operation and effect as in the first embodiment can be provided. Moreover, since the bumps 41 are provided with the high density parts 43 formed of the second anisotropic conductive paste P2 having a relatively higher density of conductive material, electrical connections between the substrate-side pads 14 and the bump pads 21 can be assured independent of the strength/weakness of the pressurizing force to the bumps 41.

Fourth Embodiment

Hereinafter, a fourth embodiment of the present invention will be described with reference to FIG. 12 to FIG. 14B. The main difference of this embodiment from the first embodiment is that a plurality of kinds of bumps 51 formed of a plurality of kinds of anisotropic conductive pastes PA, PB, PC, PD which are different in density of conductive material from each other are provided. Note that the same structures as in the first embodiment are designated the same reference numerals, and explanations of which are omitted.

Figure 12:
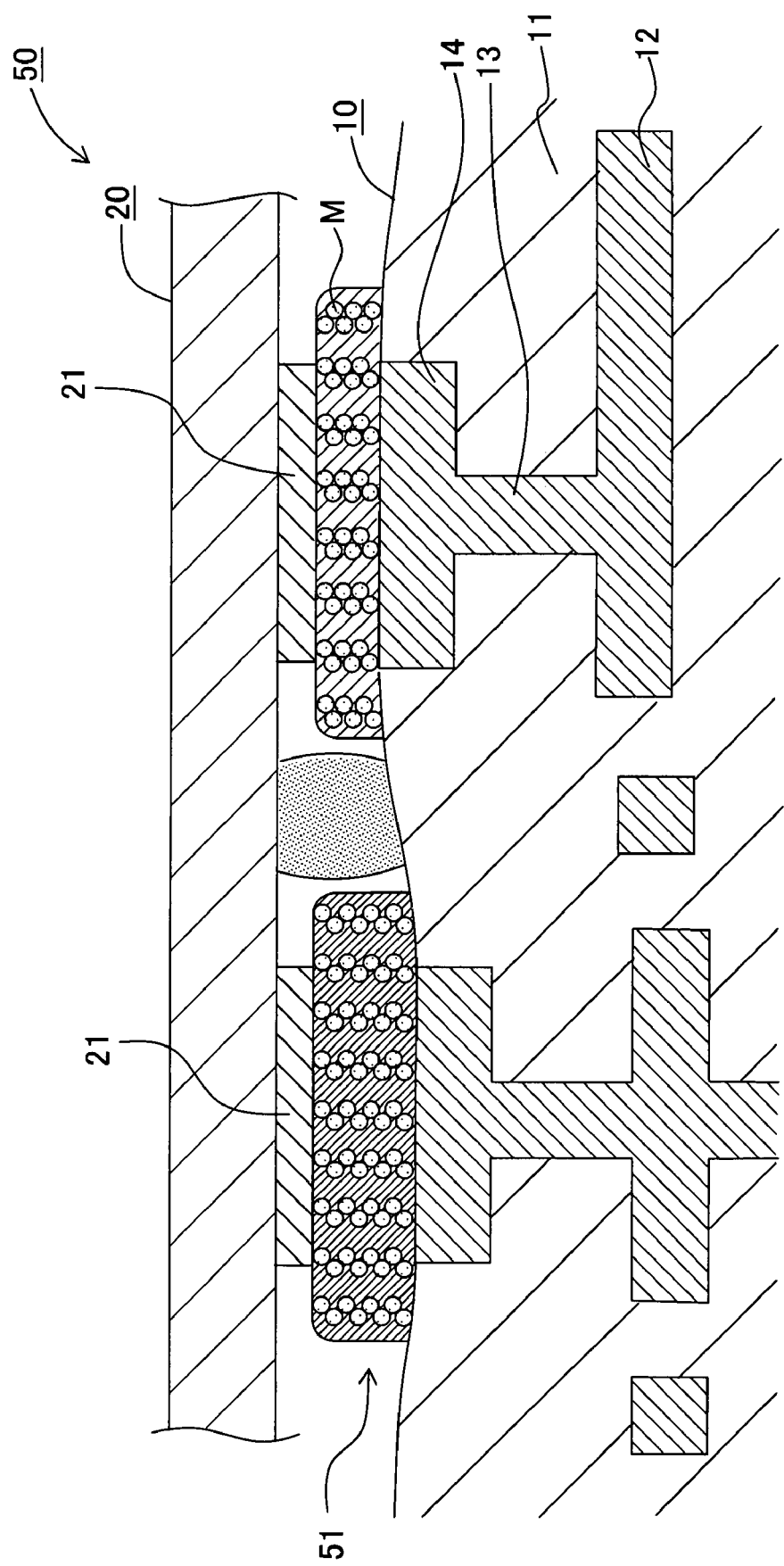
FIG. 12 is a partially enlarged cross-sectional view of a circuit substrate of a fourth embodiment.

Also in a circuit substrate 50 of this embodiment, bump pads 21 of the LSI package 20 and corresponding substrate-side pads 14 of the ceramic wiring board 10 are connected via the bumps 51 respectively (see FIG. 12).

Each of the bumps 51 of this embodiment is formed in a substantially disc shape by anisotropic conductive pastes PA, PB, PC, PD. The plurality of bumps 51 connecting a plurality of pairs of substrate-side pads 14 and bump pads 21 include a plurality of kinds of bumps 51A, 51B, 51C, 51D formed respectively by the anisotropic conductive pastes PA, PB, PC, PD which are different in density of conductive material from each other. Note that in the following, when the plurality of kinds of bumps are to be distinguished, indices are given to the reference numerals such as "bumps 51A, 51B, 51C, 51D", while when the plurality of kinds of bumps are not to be distinguished but are referred generally, indices are not given to the reference numeral such as "bumps 51."

Here, "different in density of conductive material" means that the weight of conductive material per unit volume is different. To prepare anisotropic conductive pastes which are different in density of conductive material from each other, it is conceivable that, for example, the number of particles M of a conductive material per unit volume dispersed in resin is differentiated or mean particle diameters of particles M are differentiated. Materials of the resin and the conductive material forming the plurality of kinds of anisotropic conductive pastes may be the same as or different from each other.

Each of the bumps 51 is given conductivity in a pressurizing direction by being compressed appropriately between a bump pad 21 and a substrate-side pad 14, and thereby the bump pad 21 and the substrate-side pad 14 are connected electrically. Note that in the bumps 51 formed of an anisotropic conductive paste having a higher density of conductive material, conductivities are assured by a weaker pressurizing force.

Figure 25:
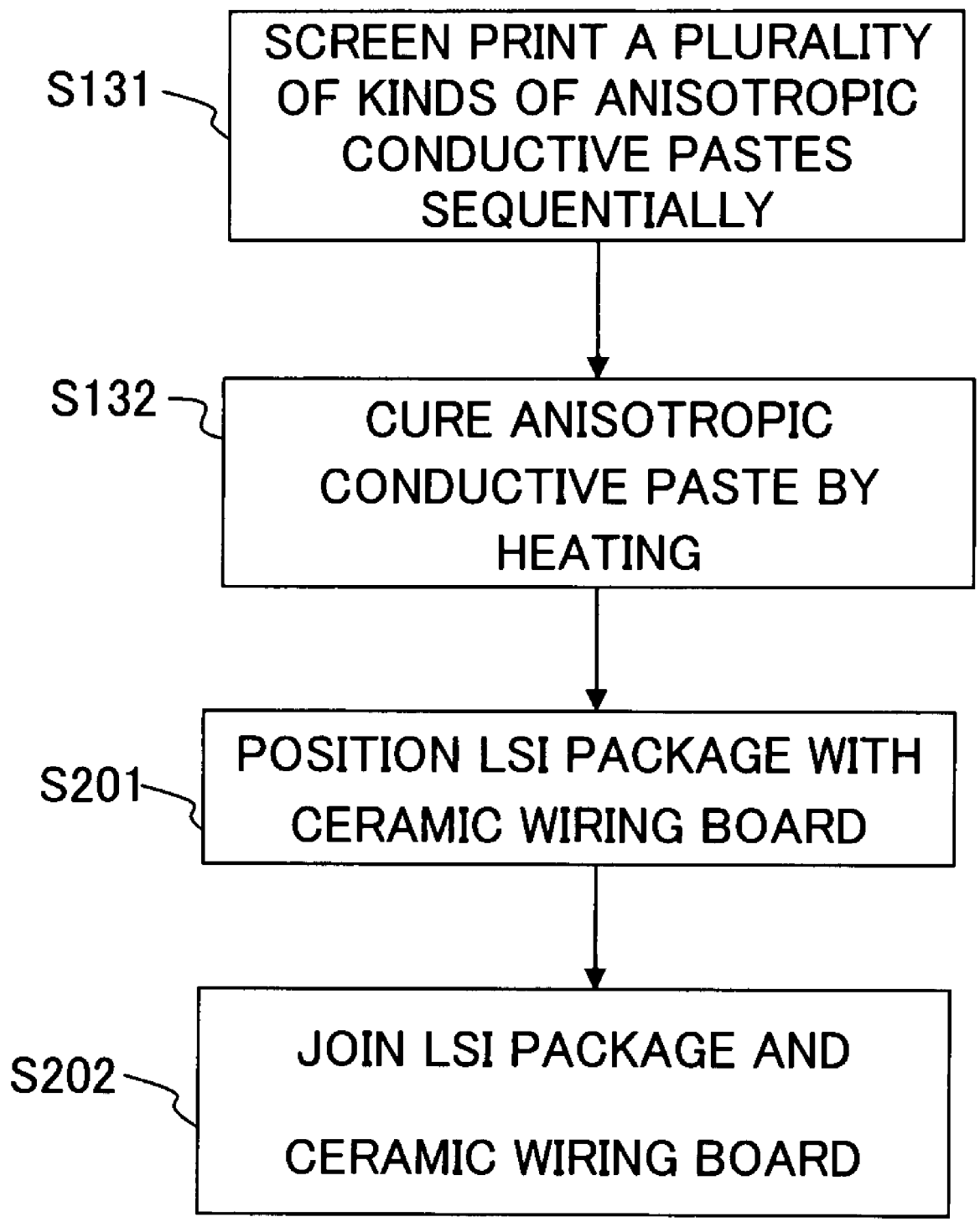
FIG. 25 is a flowchart showing procedures of a method for forming bumps and a method for connecting an LSI package and a ceramic wiring board in the fourth embodiment.

Next, a method for forming the bumps 51 and a method for connecting the bump pads 21 and the corresponding substrate-side pads 14 by the bumps 51 will be explained with reference to the flowchart in FIG. 25.

Figure 13A:
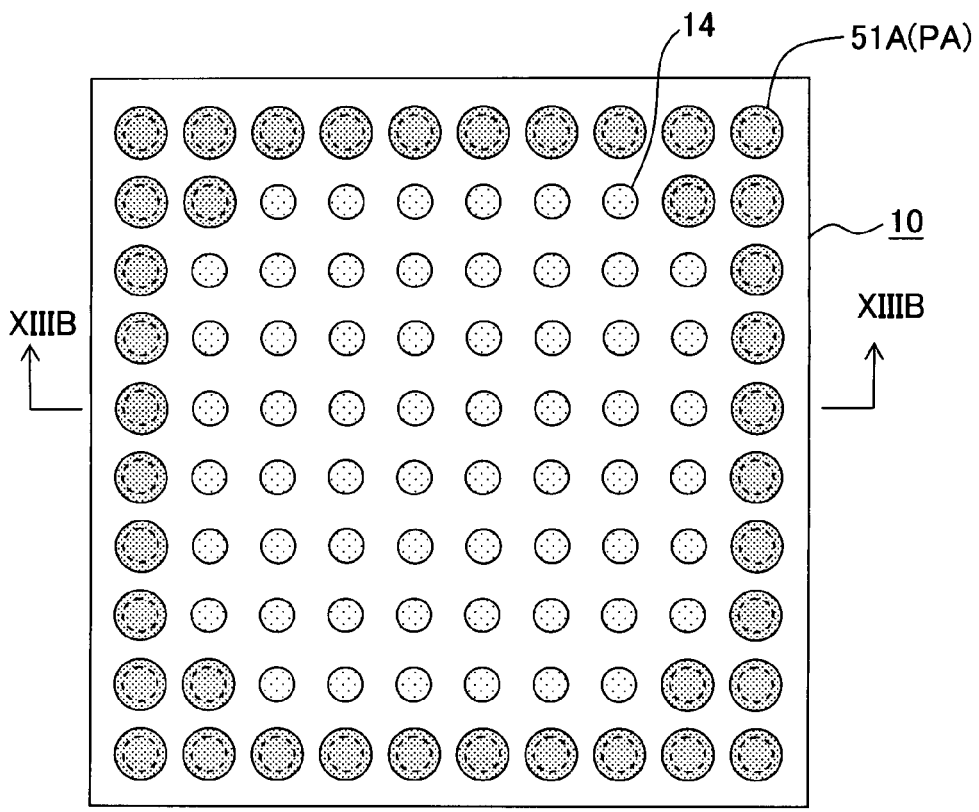
FIG. 13A is a top view showing a state that an anisotropic conductive paste is printed on part of substrate-side pads of a ceramic wiring board by a screen printing method to form bumps.
Figure 13B:
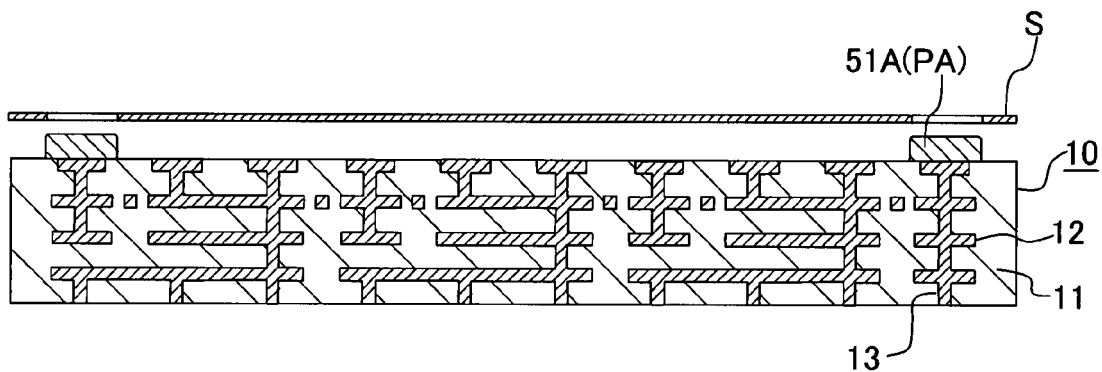
FIG. 13B is a cross-sectional view taken along the line XIIIB-XIIIB in FIG. 13A.
Figure 14A:
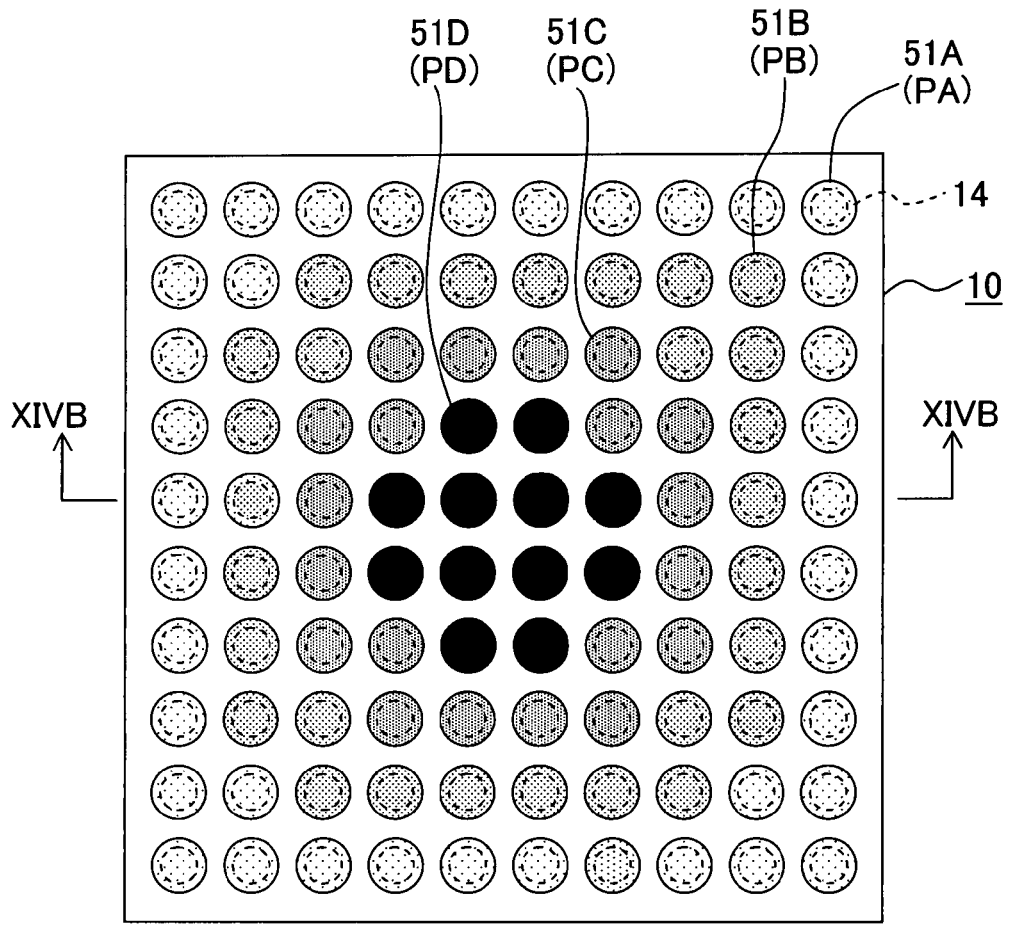
FIG. 14A is a top view showing another state that an anisotropic conductive paste is printed on substrate-side pads of the ceramic wiring board by a screen printing method to form bumps.
Figure 14B:
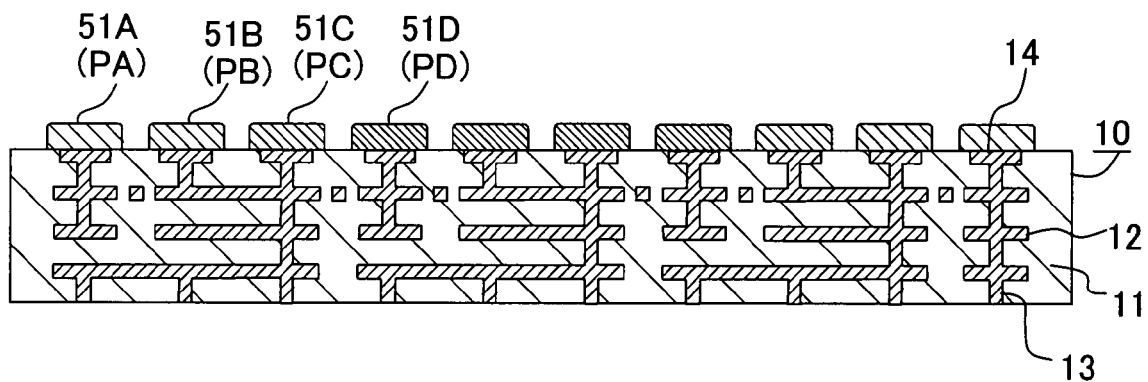
FIG. 14B is a cross-sectional view taken along the line XIVB-XIVB in FIG. 14A.

First, on the substrate-side pads 14 of the ceramic wiring board 10, the anisotropic conductive pastes PA, PB, PC, PD are printed by a screen printing method to thereby form the bumps 51 (step S131: printing step). At this time, the plurality of kinds of anisotropic conductive pastes PA, PB, PC, PD which are different in density of conductive material from each other is screen printed sequentially on the substrate-side pads 14. In this embodiment, first, the anisotropic conductive paste PA having a lowest density of conductive material is printed on a group of substrate-side pads 14 located close to the peripheral edge of the ceramic wiring board 10 to form the bumps 51A (FIG. 13A, FIG. 13B). Next, the anisotropic conductive paste PB which is higher in density of conductive material than that used in the first time of printing is printed on a group of substrate-side pads 14 located on positions closer to the center of the ceramic wiring board 10 to form the bumps 51B. Further, the anisotropic conductive pastes PC, PD which are higher in density of conductive material are printed sequentially on a group of substrate-side pads 14 located on positions much closer to the center of the ceramic wiring board 10 to form the bumps 51C, 51D. In this manner, the plurality of kinds of anisotropic conductive pastes PA, PB, PC, PD are printed sequentially, thereby making the bumps 51 formed on the substrate-side pads 14 arranged at positions closer to the center of the ceramic wiring board 10 when viewed from the upper surface (mounting surface for the LSI package 20) have a higher density of conductive material (see FIG. 14A, FIG. 14B). After the printing is completed, the anisotropic conductive pastes PA, PB, PC, PD are cured by heating (step S132: curing step).

When the bumps 51 are formed on the substrate-side pads 14 in this manner, the LSI package 20 is mounted on the ceramic wiring board 10 similarly to the first embodiment (step S201: positioning step; step S202: joining step). At this time, the anisotropic conductive pastes PA, PB, PC, PD forming the bumps 51 are compressed between the bump pads 21 and the substrate-side pads 14, and thereby conductivity is given in a pressurizing direction. Thus, the substrate-side pads 14 and the bump pads 21 are connected electrically.

Here, when bending and/or surface irregularities of the ceramic wiring board 10 are large, dispersion in pressurizing forces to the bumps 51 occurs depending on distances between the substrate-side pads 14 and the bump pads 21. In particular, a sufficient compressive force is not applied to the bumps 51 formed at positions where the distances between the substrate-side pads 14 and the bump pads 21 are large (refer to the bump 51 on the left side in FIG. 12), which may result in a situation such that the conduction is not assured sufficiently. However, in this embodiment, as the bumps 51, there are provided a plurality of kinds of bumps formed of anisotropic conductive pastes PA, PB, PC, PD which are different in density of conductive material from each other. Therefore, by arranging the bumps 51 formed of the anisotropic conductive paste having a higher density of conductive material at positions where the spacing distances between the substrate-side pads 14 and the bump pads 21 are larger, the reliability of connection can be assured. The ceramic wiring board 10 generally tends to bend with the upper surface thereof concave inward, and the closer to the center of the ceramic wiring board 10, the larger the distances between the substrate-side pads 14 and the bump pads 21 tend to be. Accordingly, in this embodiment, at positions closer to the center, the bumps 51 formed of the anisotropic conductive paste having a higher density of conductive material are arranged, thereby assuring the reliability of connection.

As described above, also in this embodiment, since the substrate-side pads 14 and the bump pads 21 are connected by the bumps 51 formed of the anisotropic conductive pastes PA, PB, PC, PD, the same operation and effect as in the first embodiment can be provided. Moreover, since there are provided as the bumps 51 the plurality of kinds of bumps formed of the anisotropic conductive pastes PA, PB, PC, PD which are different in density of conductive material from each other, the reliability of connection can be assured by arranging the bumps 51 formed of the anisotropic conductive paste having a larger density of conductive material in regions where spacing distances between the substrate-side pads 14 and the bump pads 21 are larger, considering the degree of bending, positions of irregularities, and so on of the ceramic wiring board 10.

Fifth Embodiment

Hereinafter, a fifth embodiment of the present invention will be described with reference to FIG. 15A to FIG. 15E. The main difference of this embodiment from the first embodiment is that each of bumps 61 is formed of a high density part 62 (first member) formed of a first anisotropic conductive paste P1 and a base 63 (second member) formed of a second anisotropic conductive paste P2 which is lower in density of conductive material than the first anisotropic conductive paste. Furthermore, this embodiment is different in that the high density part 62 is formed not to penetrate through the bump 61, in order words, the high density part 62 is covered by the base 63, and is not in contact with a bump pad 21 of the LSI package 20. Note that the same structures as in the first embodiment are designated the same reference numerals, and explanations thereof are omitted.

Figure 15A:
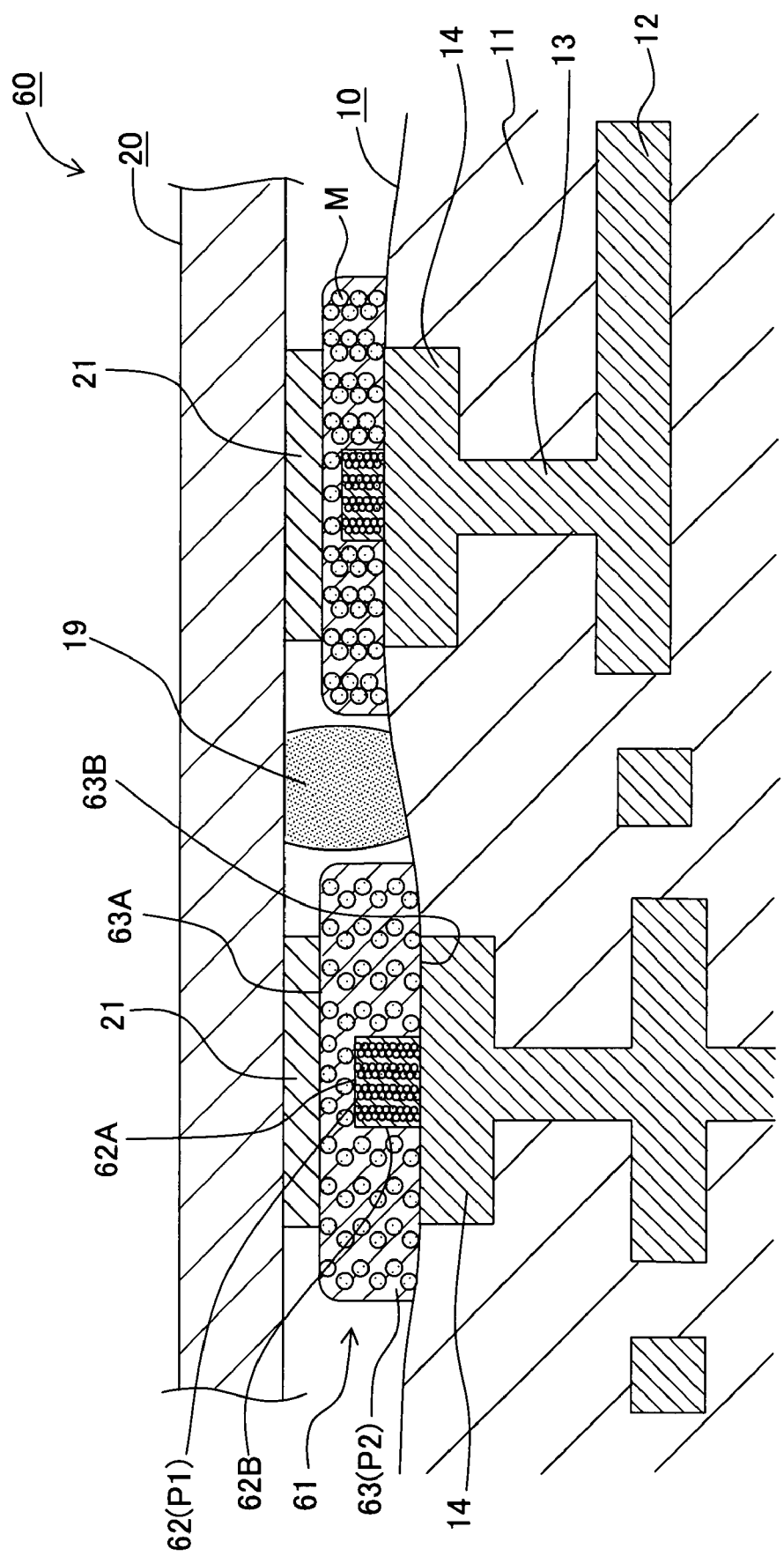
FIG. 15A is a partially enlarged cross-sectional view of a circuit substrate of a fifth embodiment.

Also in a circuit substrate 60 of this embodiment, bump pads 21 of the LSI package 20 and corresponding substrate-side pads 14 of the ceramic wiring board 10 are connected via the bumps 61 respectively (see FIG. 15A).

Each of the bumps 61 has the high density part 62 (first member) formed of the first anisotropic conductive paste P1 and the base 63 (second member) formed of the second anisotropic conductive paste P2 which is lower in density of conductive material than the first anisotropic conductive paste P1. The high density part 62 is formed in a disk shape on one of the substrate-side pad 14.

On the other hand, the base 63 is formed so as to cover an upper surface 62A and a side surface 62B of the high density part 62. Then, the base 63 contacts a bump pad 21 on an upper surface 63A and contacts the substrate-side pad 14 on a lower surface 63B.

The second anisotropic conductive paste P2 forming the base 63 is lower in density of conductive material than the first anisotropic conductive paste P1 forming the high density part 62. Here, "lower in density of conductive material" means that the weight of the conductive material per unit volume is smaller. To prepare the anisotropic conductive paste having a lower density of conductive material, it is conceivable, for example, to decrease the number of particles M of a conductive material dispersed in resin per unit volume, or to use particles M having a small mean particle diameter. Materials of the resin and the conductive material forming the two kinds of anisotropic conductive pastes P1, P2 may be the same as or different from each other.

The high density part 62 and the base 63 are both given conductivity in a pressurizing direction by being compressed appropriately between a bump pad 21 and a substrate-side pad 14, and thereby the bump pad 21 and the substrate-side pad 14 are connected electrically. In the bump 61, the high density part 62 exists in a portion where the high density part 62 and the base 63 overlap in the stacking direction of the LSI package 20 and the ceramic wiring board 10, which ensures conduction by a weaker pressurizing force as compared to a part of the bump 61 that is formed only of the base 63.

Figure 26:
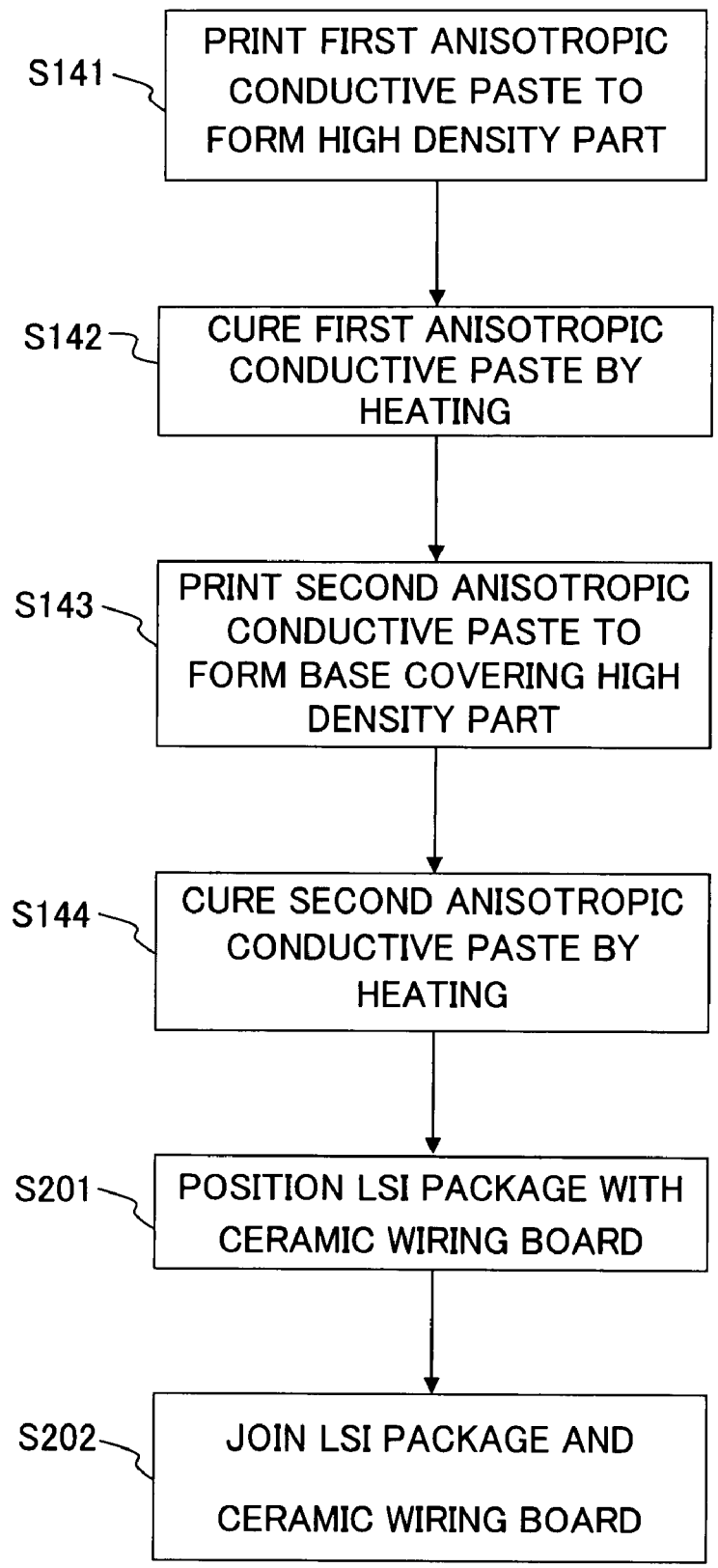
FIG. 26 is a flowchart showing procedures of a method for forming bumps and a method for connecting an LSI package and a ceramic wiring board in the fifth embodiment.

Next, a method for forming the bumps 61 and a method for connecting the bump pads 21 and the corresponding substrate-side pads 14 by the bumps 61 will be explained with reference to the flowchart in FIG. 26.

Figure 15B:
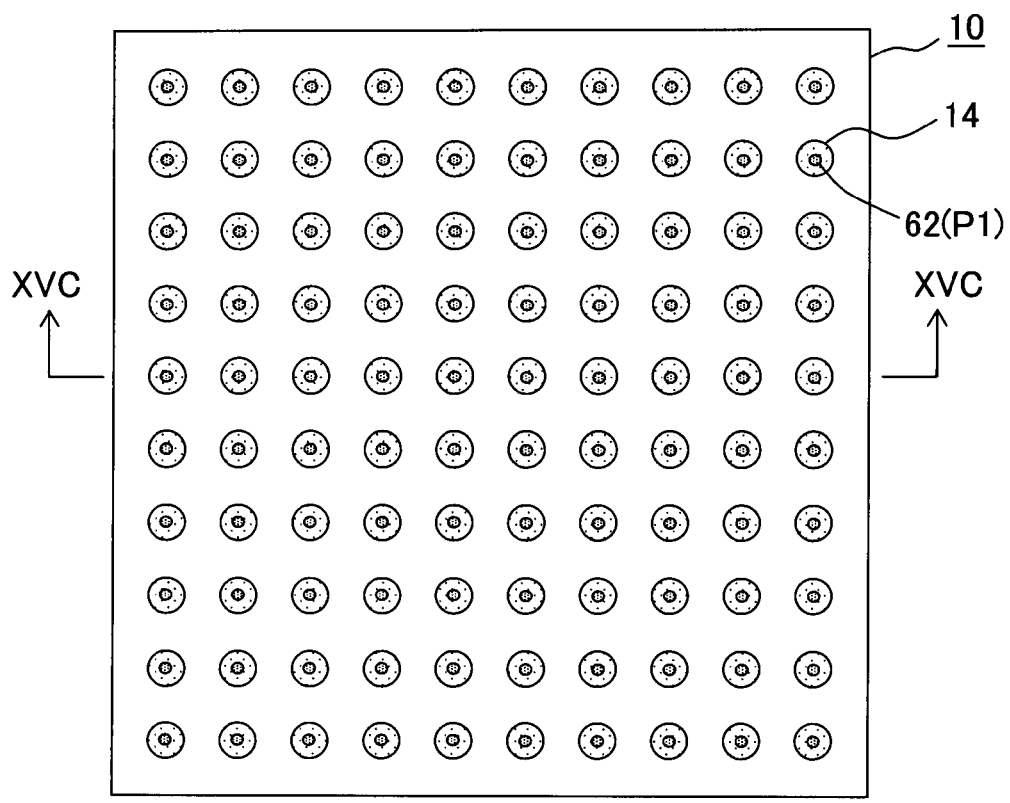
FIG. 15B is a top view showing a state that a first anisotropic conductive paste is printed on substrate-side pads of a ceramic wiring board by a screen printing method.
Figure 15C:
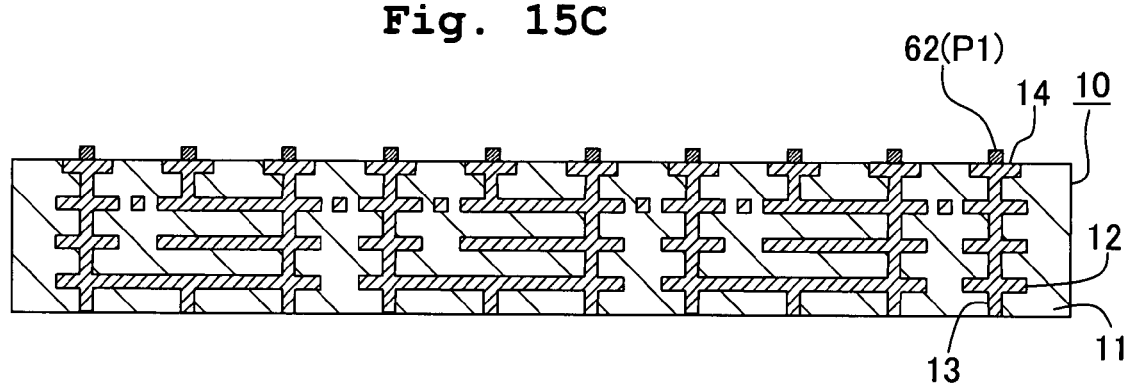
FIG. 15C is a cross-sectional view taken along the line XVC-XVC in FIG. 15B.

First, on the substrate-side pads 14 of the ceramic wiring board 10, the first anisotropic conductive paste P1 is printed by a screen printing method to thereby form the high density parts 62 in disc shapes of the bumps 15 (Step S141: printing step; see FIG. 15B, FIG. 15C). After the printing is completed, the anisotropic conductive paste P1 is cured by heating (step S142: curing step).

Figure 15D:
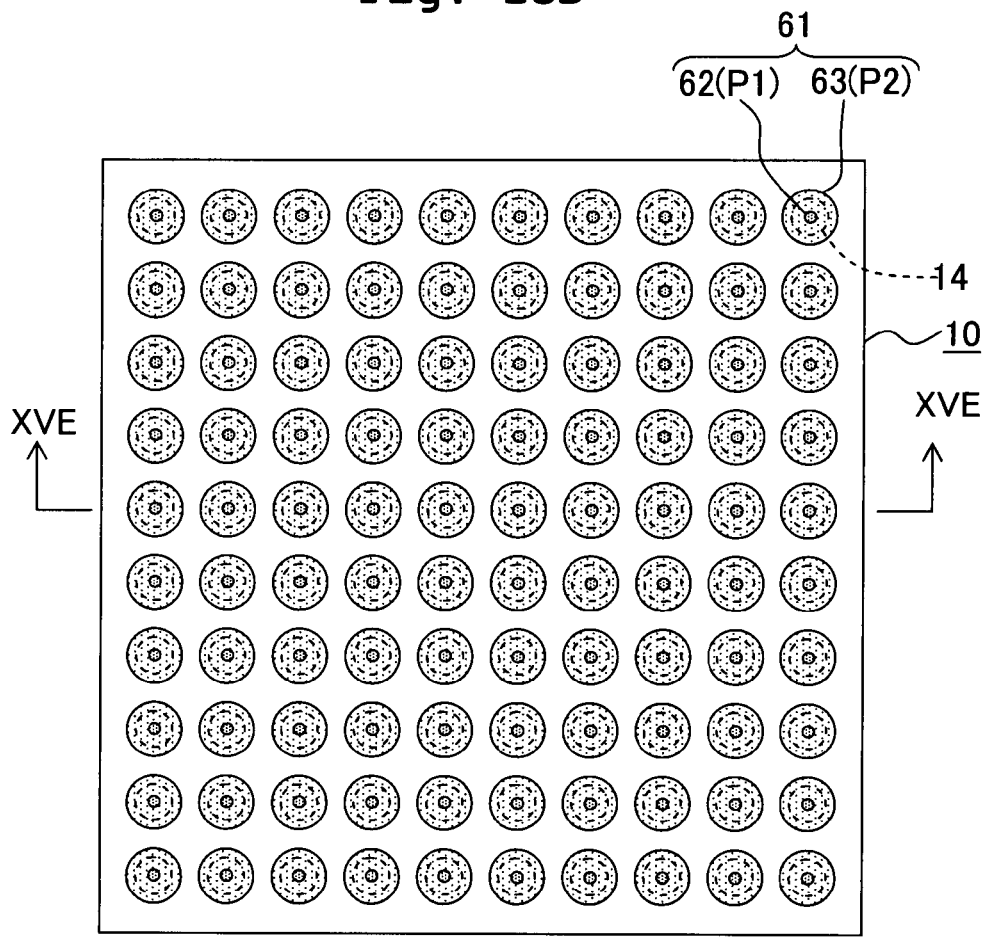
FIG. 15D is a top view showing a state that a second anisotropic conductive paste is printed further on the first anisotropic conductive paste by a screen printing method.
Figure 15E:
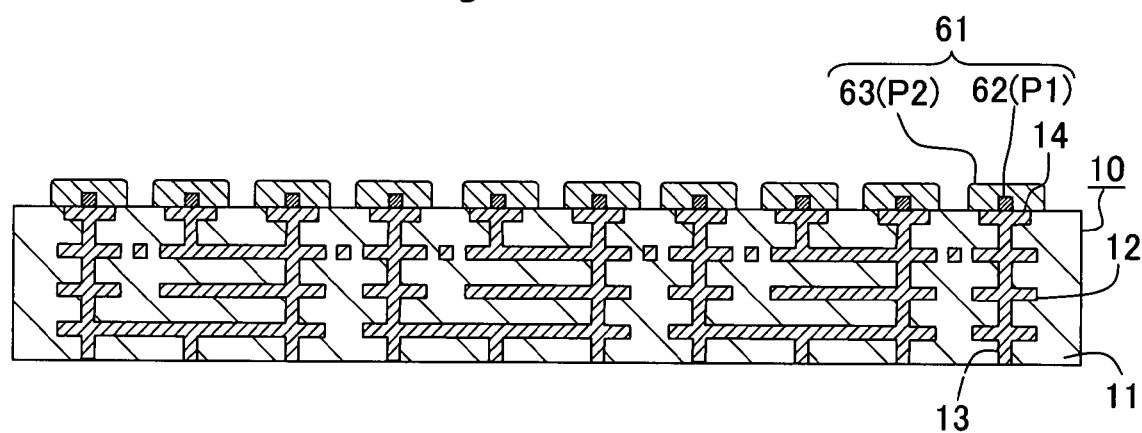
FIG. 15E is a cross-sectional view taken along the line XVE-XVE in FIG. 15D.

Next, the second anisotropic conductive paste P2 is printed by a screen printing method so as to cover the high density parts 62, thereby forming the bases 63 (step S143: second printing step; see FIG. 15E, FIG. 15D). After the printing is completed, the second anisotropic conductive paste P2 is cured by heating (Step S144: second curing step).

When the bumps 61 are formed on the substrate-side pads 14 in this manner, the LSI package 20 is mounted on the ceramic wiring board 10 similarly to the first embodiment (step S201: positioning step; step S202: joining step). At this time, the first anisotropic conductive pastes P1 forming the high density parts 62 of the bumps 61 and the second anisotropic conductive pastes P2 forming the bases 63 are compressed together between the bump pads 21 and the substrate-side pads 14, and thereby conductivity is given in the pressurizing direction. Thus, the substrate-side pads 14 and the bump pads 21 are connected electrically.

Here, when bending and/or surface irregularities of the ceramic wiring board 10 are large, dispersion in pressurizing forces to the bumps 61 occurs depending on distances between the substrate-side pads 14 and the bump pads 21. In particular, a sufficient compressive force is not applied to the bumps 61 existing at positions where the spacing distances between the substrate-side pads 14 and the bump pads 21 are large (refer to the bump 41 on the left side in FIG. 15A), which may result in a situation such that the conduction is not assured sufficiently. However, in this embodiment, the high density parts 62 are provided in the bumps 61. In the bumps 61, the high density parts 62 each formed of the first anisotropic conductive paste P1 having a relatively higher density of conductive material exist in portions where the high density parts 62 and the bases 62 overlap, which ensures conduction even by a weaker pressurizing force. Accordingly, electrical connections between the substrate-side pads 14 and the bump pads 21 can be assured.

As described above, also in this embodiment, since the substrate-side pads 14 and the bump pads 21 are connected by the bumps 61 formed of the anisotropic conductive paste P1, P2, the same operation and effect as in the first embodiment can be provided. Moreover, since the bumps 61 are provided with the high density parts 62 formed of the first anisotropic conductive paste P1 having a relatively higher density of conductive material, electrical connections between the substrate-side pads 14 and the bump pads 21 can be assured regardless of the strength/weakness of the pressurizing force to the bumps 61. Also, since the through part forming step is unnecessary, the forming step of the bumps 61 can be simplified.

Note that also in this embodiment, as explained in the third embodiment, the bumps 61 located on the more center side of the ceramic wiring board 10 when viewed from the upper surface may be provided with the high density parts 62, and moreover, the bumps 61 located closer to the center may have the high density parts 62 with larger diameters. This is because the ceramic wiring board 10 generally tends to bend with the upper surface thereof concave inward, and in regions closer to the center of the ceramic wiring board 10, distances between the substrate-side pads 14 and the bump pads 21 tend to be larger.

Namely, since the high density parts 62 are formed of the anisotropic conductive paste P2, and thus have higher flexibility as compared to the case of being formed only of a conductive material, the flexibility as an entire bump 61 is not impaired even when the diameter thereof is made larger to a certain extent. Therefore, by making the diameters of high density parts 62 larger in bumps 61 formed at positions where the spacing distances between the substrate-side pads 14 and the bump pads 21 are large, the reliability of connection can be assured further.

EXAMPLES

Hereinafter, the present invention will be described in more detail with examples. As materials, a ceramic wiring board and anisotropic conductive pastes are used.

As the ceramic wiring board, a multilayer ceramic wiring board is used, which has a well-known structure in which a plurality of insulating layers made of ceramics and conductive layers forming a predetermined pattern are stacked alternately, and the layers are connected by via holes. Note that a plurality of substrate-side pads are formed on a surface of this ceramic wiring board, and the respective substrate-side pads conduct to a back surface of the ceramic wiring board through via holes and the conductive layers as inside layers.

As the anisotropic conductive pastes, six kinds of the anisotropic conductive pastes as shown below are prepared.

The AC series of Mitsui Chemical, Co. is used as a base. This material is made by adding an acrylic/silicon based stress relief material to cold setting type epoxy resin. To this base, mixture of nickel particles having a mean particle diameter of 5 µm is added further as a conductive filler. By measurement using a particle diameter measurement apparatus of laser diffusion type while adjusting an added weight, the particle density of the conductive filler is set to 2500 pcs/mm$^3$. By such a method, an anisotropic conductive paste A with the conductive filler having the particle density of 2500 pcs/mm$^3$ is prepared.

Using nickel particles having a mean particle diameter of 10 µm as the conductive filler, an anisotropic conductive paste B with the conductive filler having a particle density of 2500 pcs/mm$^3$ is prepared by the same method as for the anisotropic conductive paste A.

Using nickel particles having a mean particle diameter of 13 µm as the conductive filler, an anisotropic conductive paste C with the conductive filler having a particle density of 4400 pcs/mm$^3$ is prepared by the same method as for the anisotropic conductive paste A.

Using nickel particles having a mean particle diameter of 10 µm as the conductive filler, an anisotropic conductive paste D with the conductive filler having a particle density of 3300 pcs/mm$^3$ is prepared by the same method as for the anisotropic conductive paste A.

Using nickel particles having a mean particle diameter of 10 µm as the conductive filler, an anisotropic conductive paste E with the conductive filler having a particle density of 4400 pcs/mm$^3$ is prepared by the same method as for the anisotropic conductive paste A.

Using nickel particles having a mean particle diameter of 10 µm as a conductive filler, an anisotropic conductive paste F with the conductive filler having a particle density of 6400 pcs/mm$^3$ is prepared by the same method as for the anisotropic conductive paste A.

Preliminary Experiment

On a surface of the ceramic wiring board, surface processing such as polishing, cleansing, and the like are performed. On substrate-side pads of this ceramic wiring board, the anisotropic conductive paste A is printed at 40° C. by a screen printing method, thereby forming a pattern of disc shapes each having a diameter of 40 µm to 650 µm. Note that the pattern is given a height of 30 µm, and this pattern is heated at 150° C. for 40 seconds and then heated at 180° C. for 15 seconds to cure the anisotropic conductive paste, thereby forming bumps.

Using a tension and compression testing machine, while varying the load applied to the bumps from 0 g/mm$^2$ to 400 g/mm$^2$, contact resistance thereof is measured. Note that the tension and compression testing machine is a machine having a table on which a measured object is set and a measurement terminal which contacts the measured object while applying a desired load thereto. The tension and compression testing machine applies a predetermined current to the measured object when the desired load is applied thereto and then measures a voltage value at this moment, to thereby calculate a contact resistance value. In this example, the ceramic wiring board on which the bumps are formed is set on the table, and the measurement terminal is contacted with the bumps while applying a desired load thereto, to thereby measure the contact resistance value by the tension and compression testing machine.

Example 1-1

On a surface of the ceramic wiring board, surface processing such as polishing, cleansing, and the like are performed. On substrate-side pads of this ceramic wiring board, the anisotropic conductive paste A is printed at 40° C. by a screen printing method, thereby forming a pattern of disc shapes each having a diameter of 300 µm and a height of 30 µm. This pattern is heated at 150° C. for 40 seconds and then heated at 180° C. for 15 seconds to be cured, thereby forming bumps. Contact resistance of the formed bumps is measured using the tension and compression testing machine while varying the load applied to the bumps from 0 g/mm$^2$ to 400 g/mm$^2$.

Example 1-2

Using the anisotropic conductive paste B, bumps are formed similarly to the example 1-1 and contact resistance thereof is measured.

Example 2-1

On a surface of the ceramic wiring board, surface processing such as polishing, cleansing, and the like are performed. On substrate-side pads of this ceramic wiring board, the anisotropic conductive paste A is printed at 40° C. by a screen printing method, thereby forming a pattern of disc shapes each having a diameter of 300 µm and a height of 30 µm. This pattern is heated at 150° C. for 40 seconds and then heated at 180° C. for 15 seconds to be cured, thereby forming bases of bumps. Next, laser is irradiated from upper surface sides of the bases to thereby form through holes each having a diameter of 5 µm. Then, by performing electroplating with the substrate-side pads being one of electrodes, copper is filled in the through holes, thereby forming conductive parts. Furthermore, Ni/Au protective films are formed on upper end surfaces of the conductive parts by electroless plating. Contact resistance of the formed bumps is measured similarly to the example 1-1.

Example 2-2

Using the anisotropic conductive paste B, bumps are formed similarly to the example 2-1 and contact resistance thereof is measured.

Example 3

On the surface of the ceramic wiring board, surface processing such as polishing, cleansing, and the like are performed. On substrate-side pads of this ceramic wiring board, the anisotropic conductive paste B is printed at 40° C. by a screen printing method, thereby forming a pattern of a plurality of kinds of ring shapes each having an outside diameter of 300 μm, a height of 30 μm and a different inner diameter. The formed pattern is heated at 150° C. for 40 seconds and then heated at 180° C. for 15 seconds to be cured, thereby forming bases of bumps. Then, the anisotropic conductive paste C is filled in the through holes by a screen printing method. The paste after filling is heated at 150° C. for 40 seconds and then heated at 180° C. for 15 seconds to be cured, thereby forming high density parts. Contact resistance of the formed bumps is measured similarly to the example 1-1.

Example 4

On the surface of the ceramic wiring board, surface processing such as polishing, cleansing, and the like are performed. On substrate-side pads of this ceramic wiring board, anisotropic conductive pastes B, D, E, F are printed respectively at 40° C. by a screen printing method, thereby forming a pattern of disc shapes each having a diameter of 300 μm, an inner diameter of 30 μm, and a height of 30 μm. This pattern is heated at 150° C. for 40 seconds and then heated at 180° C. for 15 seconds to be cured, thereby forming bumps. Contact resistance of the formed bumps is measured similarly to the example 1-1.

Figure 16:
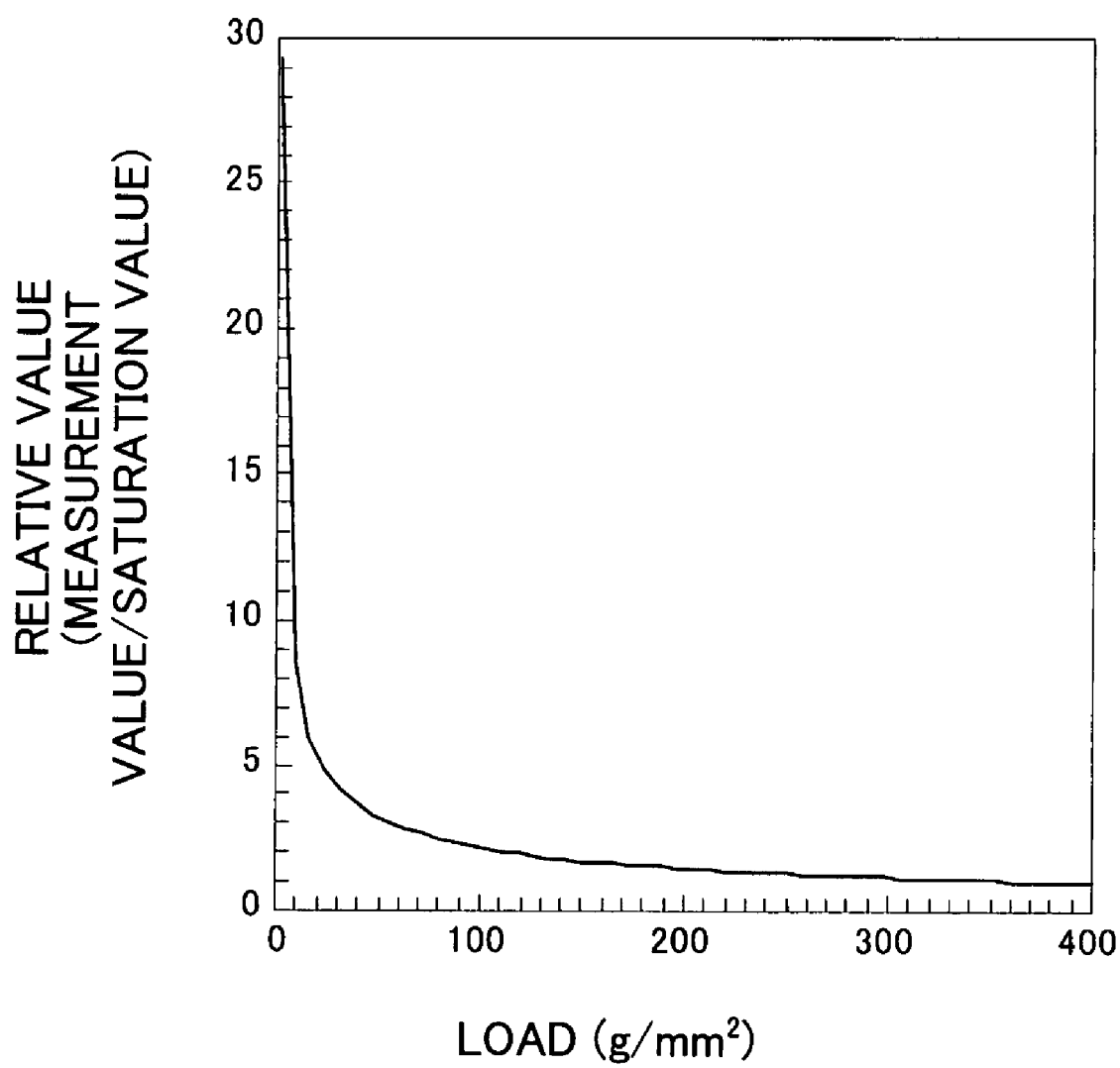
FIG. 16 is a graph representing a relationship between loads to bumps and relative values of contact resistance in a preliminary experiment.
Figure 17:
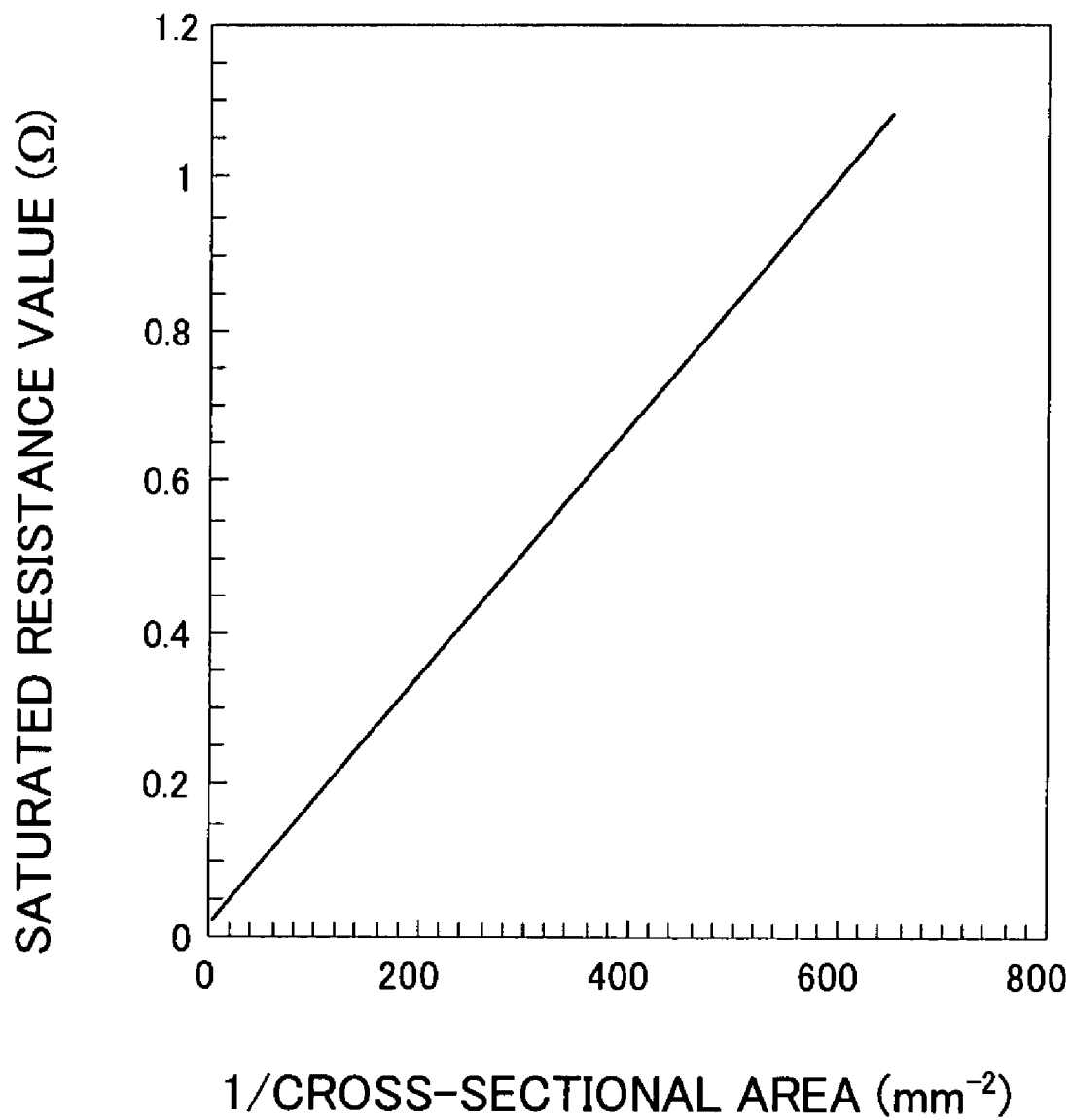
FIG. 17 is a graph representing a relationship between bump sizes and saturation values of contact resistance in the preliminary experiment.

FIG. 16 shows a graph representing a relationship between loads to the bumps and contact resistance values in the preliminary experiment. Note that relative values are ratios of measurement values to saturation values of the contact resistance. The contact resistance values saturated by a load of 400 g/mm$^2$, and thereby exhibited stable electrical connectivity. FIG. 17 shows a graph representing a relationship between bump sizes and saturation values of contact resistance in the preliminary experiment. Note that the bump sizes on the horizontal axis are shown by inverse numbers of cross-sectional areas of the bumps. It can be seen that the saturation values of contact resistance increase as the cross-sectional areas of the bumps decrease. Accordingly, it can be said that as a bump size becomes smaller, increase in contact resistance due to dispersion in load must be suppressed more.

Figure 18:
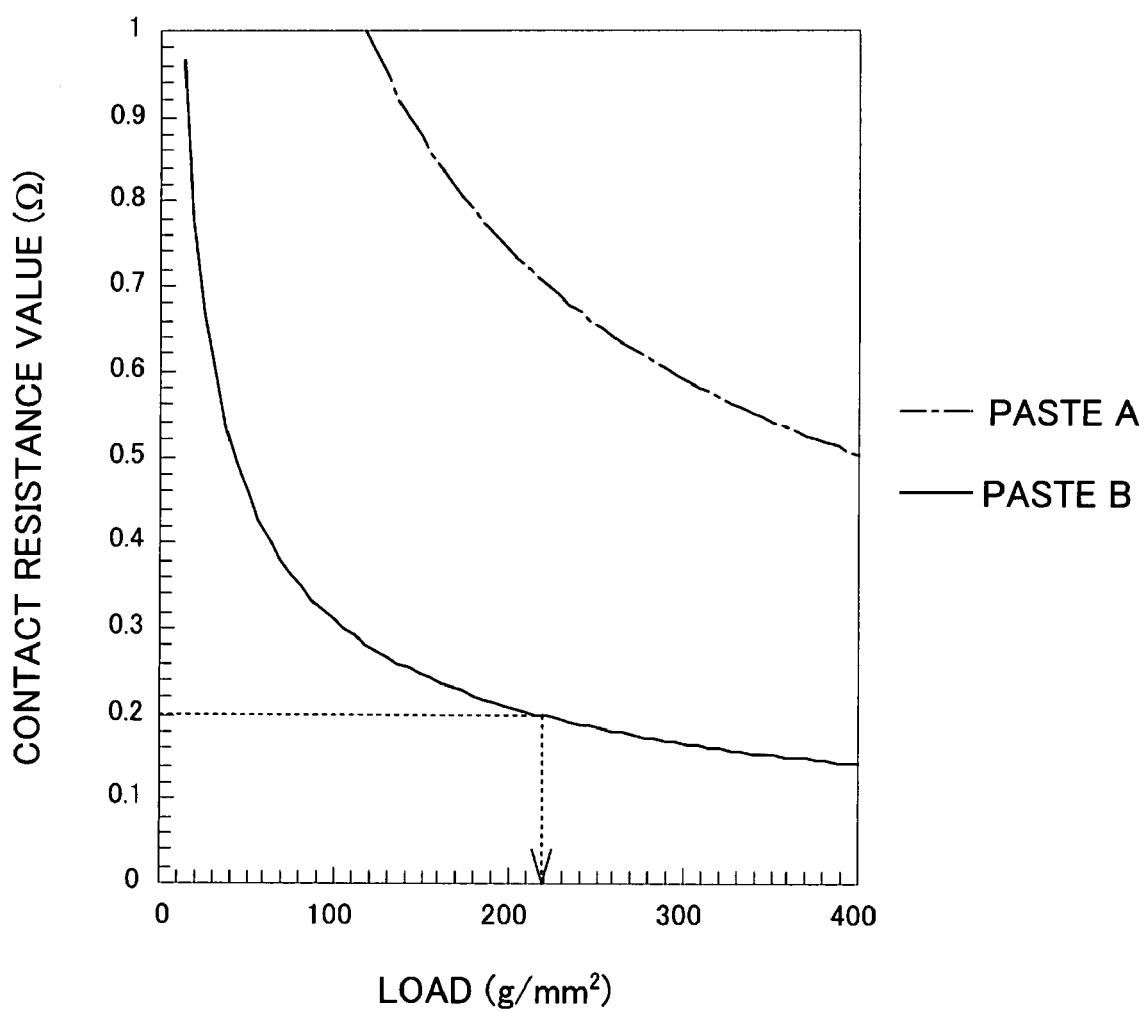
FIG. 18 is a graph representing a relationship between loads to bumps and contact resistance values in example 1-1 and example 1-2.

FIG. 18 shows a graph representing a relationship between loads to the bumps and contact resistance values in the example 1-1 (paste A) and the example 1-2 (paste B). It can be seen that the bumps using the paste B having a higher density of conductive material (particle diameter of used conductive material is large) has smaller contact resistance and hence good conductivity.

Figure 19:
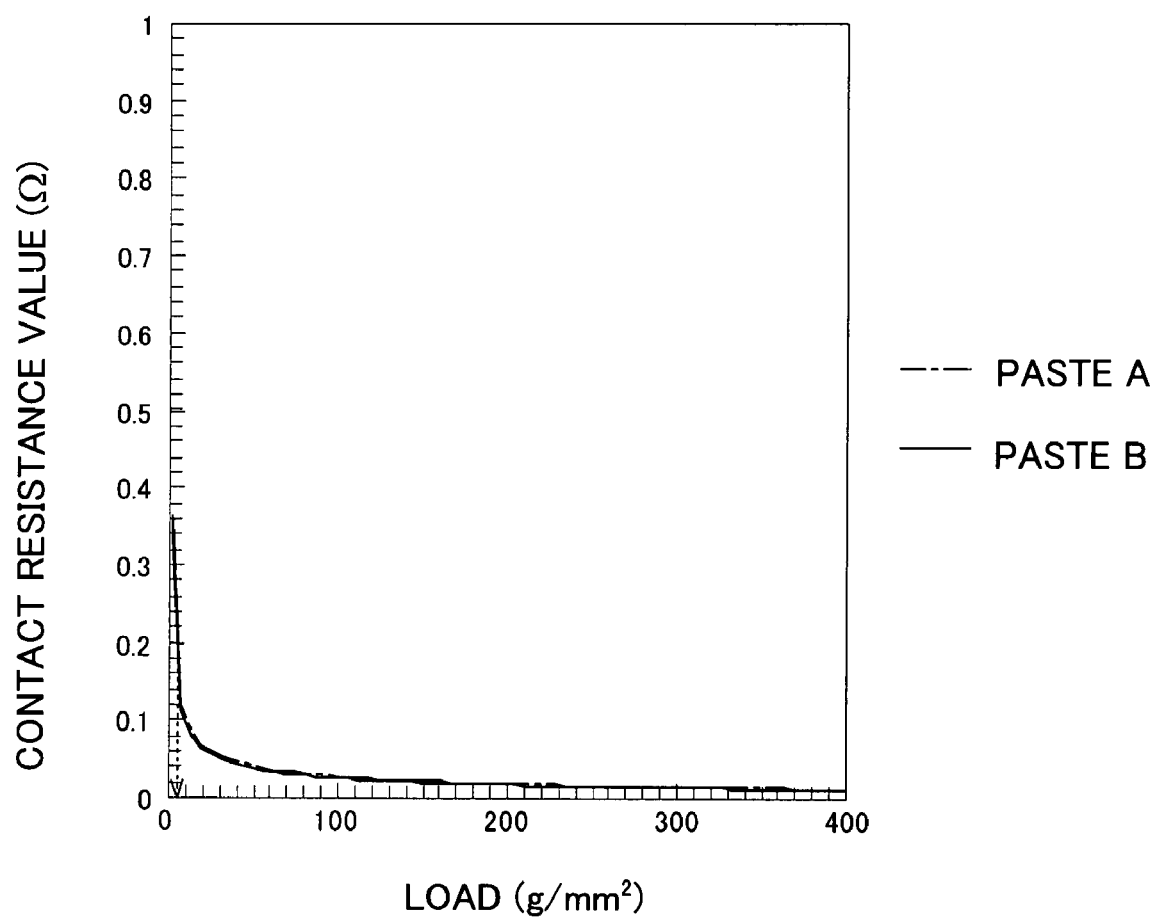
FIG. 19 is a graph representing a relationship between loads to bumps and contact resistance values in example 2-1 and example 2-2.

FIG. 19 shows a graph representing a relationship between loads to the bumps and contact resistance values in the example 2-1 (paste A) and the example 2-2 (paste B). When the tolerance value of contact resistance is 200 mΩ, it is sufficient to apply a load of about 2.9 g/mm$^2$ or larger in the example 2-1 and a load of about 2.6 g/mm$^2$ or larger in the example 2-2. In comparison with FIG. 18, it can be seen that the contact resistance largely decreases by providing the conductive parts, and the conductivity can be significantly improved.

Figure 20:
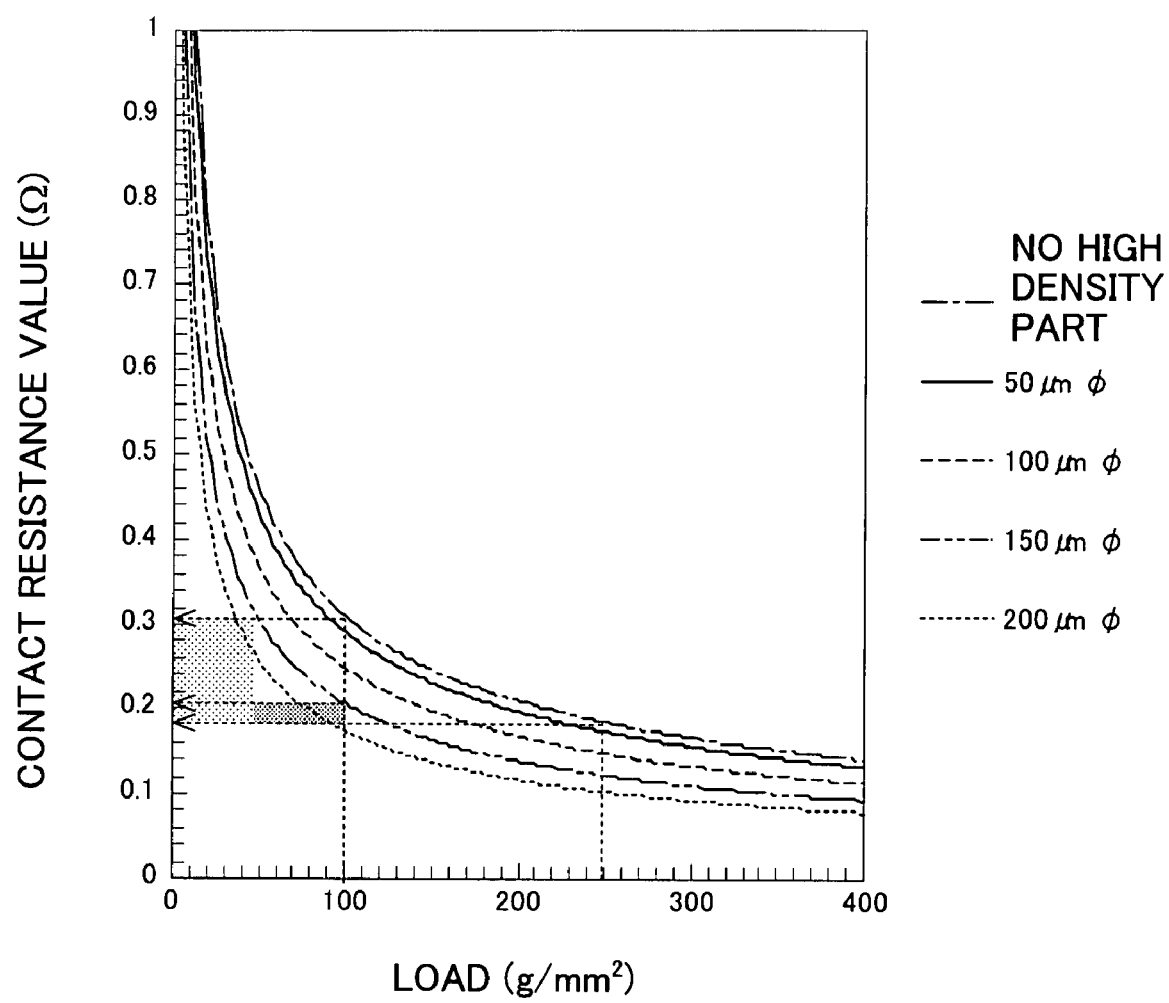
FIG. 20 is a graph representing a relationship between loads to bumps and contact resistance values when diameters of high density portions are 50 μm, 100 μm, 150 μm, 200 μm and when the high density portions are not provided, in example 3.

FIG. 20 shows a graph representing a relationship between loads to the respective bumps and contact resistance values when diameters of high density parts are set to 50 μm, 100 μm, 150 μm, 200 μm in the example 3. Note that for comparison, experimental results of bumps not provided with high density parts are shown together. In comparison with the bumps not provided with high density parts, it can be seen that, in the bumps provided with the high density parts, contact resistance values by the same load decreased, and the conductivity is improved. Also, it can be seen that the larger the diameters of the high density parts become, the more the conductive resistance values decrease.

Here, when it is assumed that dispersion in load to the bumps due to the degree of bending and/or irregularities of the substrate is about 100 g/mm$^2$ to 250 g/mm$^2$, dispersion in contact resistance value is about 130 mΩ when the high density parts are not provided. On the other hand, when the bumps are arranged appropriately such that the bumps with the high density parts each having a larger diameter are arranged in a region where the loads to the bumps become small, the dispersion in contact resistance can be reduced. For example, when bumps with high density parts each having a diameter of 200 μm are arranged in a region with the smallest load of 100 g/mm$^2$, and bumps not provided with the high density parts are arranged in a region with the largest load of 250 g/mm$^2$, the dispersion in contact resistance can be reduced to about 30 mΩ.

Figure 21:
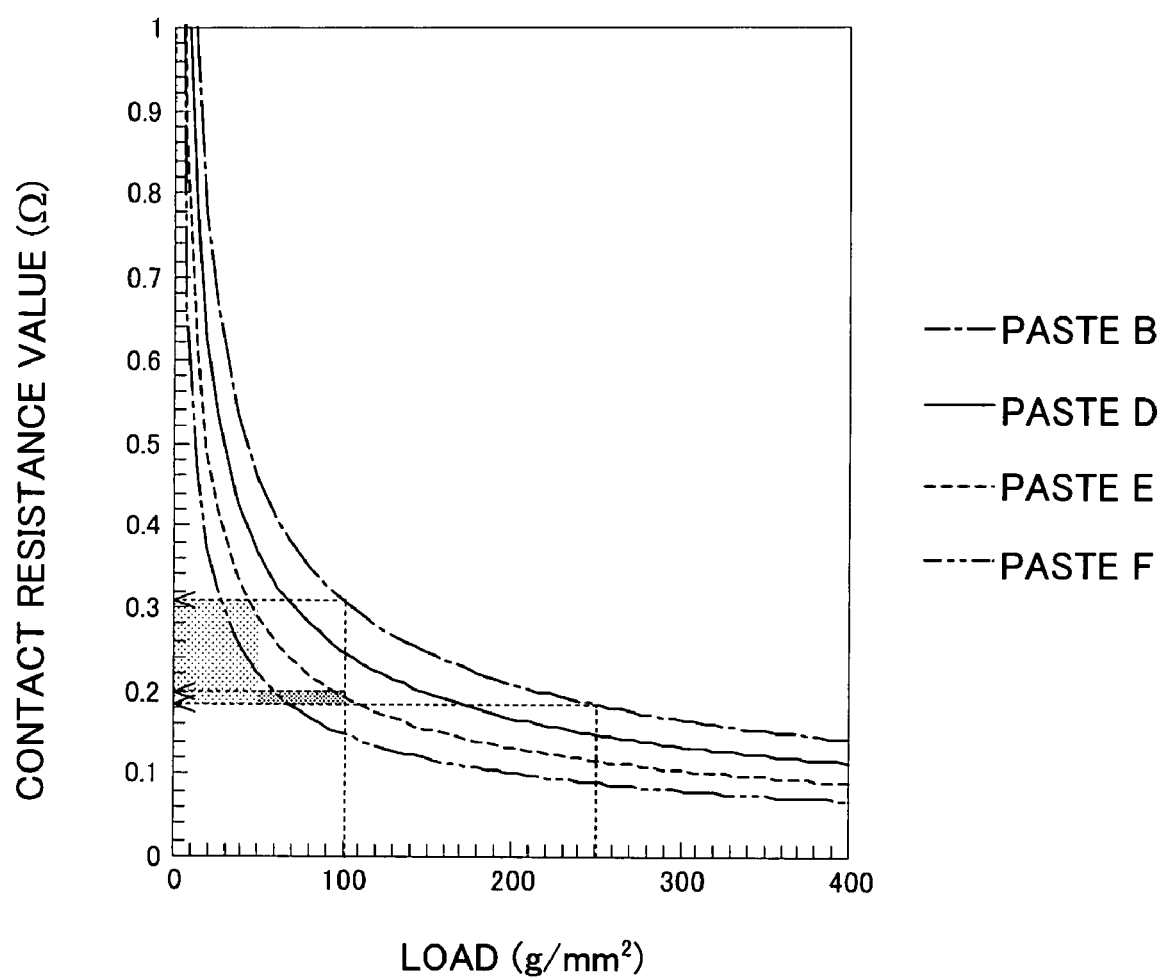
FIG. 21 is a graph representing a relationship between loads to respective bumps and contact resistance values in bumps formed using anisotropic conductive pastes B, C, D, E in example 4.

FIG. 21 shows a graph representing a relationship between loads to the respective bumps and contact resistance values in the bumps formed using the anisotropic conductive pastes B, D, E, F in the example 4. It can be seen that the bumps using a paste having a higher density of conductive material have smaller contact resistance.

Here, when it is assumed that the dispersion in load to the bumps due to the degree of bending and/or irregularities of the substrate is about 100 g/mm$^2$ to 250 g/mm$^2$, large dispersion in contact resistance values occurs when bumps of one kind are used as single bodies, and for example, it is about 130 mΩ in the bumps using the anisotropic conductive paste B. On the other hand, when the bumps are arranged appropriately so that the anisotropic conductive paste having a higher density of conductive material are arranged in a region where the loads to the bumps become small, the dispersion in contact resistance can be reduced. For example, when the bumps using the anisotropic conductive paste F are arranged in a region with the smallest load of 100 g/mm$^2$, and the bumps using the anisotropic conductive paste B are arranged in a region with the largest load of 250 g/mm$^2$, the dispersion in contact resistance can be reduced to 30 mΩ.

Other Embodiments

The scope of the present invention is not limited to the above-described embodiments, and for example, embodiments as described below are also included in the scope of the present invention.

In the above embodiments, the LSI package 20 is shown as an example of the electronic device, but the type of the electronic device is not limited as in the above embodiments, where any one can be applied as long as it can be connected to a substrate via bumps.

In the first embodiment and the second embodiment, copper is used as plating metal for forming the conductive parts 17, 33 or the conductive film 34, but any metal can be used as long as it can be plated such as tin, silver, solder, copper/tin, copper/silver, and the like for example.

In the second embodiment, each of the conductive film 34 is formed in a thin film form covering the connecting surface 32A as a region of a base 32 corresponding to a bump pad 21 and the exposed surface 32B which is not in contact with either the ceramic wiring board 10 or the LSI package 20, but the conductive film 34 may be formed only on the connecting surfaces for the bump pads 21. The conductive film 34 may be formed between the base 32 and the substrate-side pad 14. Moreover, the conductive film 34 may be formed both between the base 32 and the bump pad 21 and between the base 32 and the substrate-side pad 14. In this case, it is necessary to form the conductive film 34 on the substrate-side pad 14 before the base 32 and the conductive part 33 are formed.

In the second embodiment, the conductive parts 33 and the conductive films 34 are formed by one plating step, but for example the plating step may be performed by two steps, to thereby form the conductive parts and the conductive films of different conductive materials.

In the first embodiment, the conductive parts 17 are formed by electroplating, but the conductive parts 17 may be formed by electroless plating. Further, also when the conductive parts and the conductive films are formed in the plating step as in the second embodiment, the conductive parts and the conductive films may be formed by electroplating for example when the substrate-side pads conduct to the lower side surface (surface on the reverse side of the substrate-side pads) of the substrate through the via holes.

In the third embodiment, the bumps 41 arranged at positions closer to the center of the ceramic wiring board 10 are provided with the high density parts 43 having larger diameters when viewed from the upper surface (mounting surface for the LSI package 20), but the arrangement of the bumps with high density parts having differentiated diameters are not limited as in the above embodiment, and appropriate arrangement may be determined considering a state of bending and/or surface irregularities of the substrate. Also, in the fourth embodiment, similarly the arrangement of the bumps with the anisotropic conductive pastes of differentiated types to be used are not limited as in the above embodiment, and appropriate arrangement may be determined considering a state of bending and/or surface irregularities of the substrate.

In the third embodiment, adjustment is made such that the high density parts 43 are formed by the second anisotropic conductive paste which is higher in density of conductive material than the first anisotropic conductive paste to thereby lower conduction resistance, but in reverse, adjustment may also be made such that the density of the conductive material in the second anisotropic conductive paste is made lower than the density of the conductive material in the first anisotropic conductive paste to form low density parts instead of the high density parts 43 so that the conduction resistance becomes not too low. When the conduction resistance between the bump pads 21 and the substrate-side pads 14 is too low, it is possible that excessive voltage is applied to the LSI package 20 to cause damage, but the adjustment can be made to avoid such a problem.

In the above-described respective embodiments, there are shown an example in which bumps are provided with conductive parts, conductive films or high density parts, and an example in which connections are made by a plurality of bumps with different kinds of anisotropic conductive pastes to be used, but in a connection structure in which a plurality of connection terminals and a plurality of connectors paired with the connection terminals are connected respectively by bumps, all the pairs of connection terminals and connectors may be connected by bumps which are formed by a single anisotropic conductive paste and provided with no conductive part and no high density part.

In the above-described respective embodiments, physical joining of the LSI package 20 with the ceramic wiring board 10 is made by the adhesive 19, but another joining means may be used. As an example of another joining means is a mechanical joining mechanism using a tray on which the LSI package 20 and the ceramic wiring board 10 are mounted and a blade for loading. This joining mechanism is explained briefly below. In the tray, there are formed a recess for positioning the LSI package 20, a recess for positioning the ceramic wiring board 10, and through holes for bolts used for fixing the blade for loading. Further, in the blade for loading, there are formed through holes for bolts, and an opening for exposing connecting terminals (terminals to be connected to the substrate-side pads 14 via the conductive layers 12) formed in the lower surface (surface opposite to the side on which the substrate-side pads 14 are formed) of the ceramic wiring board 10. Next, joining step is explained. First, the LSI package 20 is mounted on the tray so that the bump pads 21 face up. Next, the ceramic wiring board 10 is mounted to be stacked on the LSI package 20 so that the substrate-side pads 14 faces down. At this time, the LSI package 20 and the ceramic wiring board 10 are positioned by the respective recesses, and thereby the bump pads 21 and the corresponding substrate-side pads 14 contact mutually. Furthermore, the blade for loading is set on the tray. Thereby, the LSI package 20 and the ceramic wiring board 10 are in a state of being sandwiched by the tray and the blade for loading. Finally, bolts are inserted in the through holes and fastened so as to apply a desired load. According to the joining mechanism as described above, a circuit substrate is treated as a module including the tray and the blade for loading. In such a structure, the LSI package 20 and the ceramic wiring board 10 are joined with each other in a detachable manner, so that in a case that the LSI package 20 has a problem, the LSI package 20 can be replaced easily.

In the above-described embodiments, as shapes, structures, and materials of bumps, specific shapes, structures, and materials are described as examples, but the present invention is not limited to them. Any shapes, structures and materials may be used therefore as long as they provide the effects of the present invention. The above-described embodiments are an example of applying the present invention to connection of the LSI package 20 and the ceramic wiring board 10, but the present invention can be applied to connection of any electronic device and any substrate.

What is claimed is:

1. A connecting structure which electrically connects a connecting terminal provided on a substrate and a connector provided on an electronic device, the connecting structure comprising:
   a bump formed of a first conductive member, which is formed of a first anisotropic conductive paste including particles of a conductive material, and a second conductive member which is different in conductivity from the first conductive member,
   wherein the connecting terminal and the connector are connected via the bump.

2. The connecting structure according to claim 1,
   wherein the second conductive member is formed of a conductive material and formed in the first conductive member to penetrate the first conductive member from a connecting surface for the connecting terminal to another connecting surface for the connector.

3. The connecting structure according to claim 1,
wherein the bump has a conductive film formed of a conductive material; the conductive film is formed between the first conductive member and at least one of the connecting terminal and the connector, and is connected to the second conductive member.

4. The connecting structure according to claim 3,
wherein the conductive film entirely covers an exposed surface of the first conductive member.

5. The connecting structure according to claim 1,
wherein the second conductive member is formed of a second anisotropic conductive paste which is different in density of the conductive material from that of the first anisotropic conductive paste, and is formed in the first conductive member to penetrate the first conductive member from a connecting surface for the connecting terminal to another connecting surface for the connector.

6. The connecting structure according to claim 5,
wherein the connecting terminal is provided as a plurality of connecting terminals, the connector is provided as a plurality of connectors paired with the connecting terminals respectively, the bump is provided as a plurality of bumps which form a bump group and which connect the connecting terminals and the connectors respectively, and the bumps are mutually different in a diameter of the second conductive member.

7. The connecting structure according to claim 1,
wherein the first conductive member is formed in a disc shape on the connecting terminal, and the second conductive member is formed of a second anisotropic conductive paste which is lower in density of conductive material than the first anisotropic conductive paste and formed to cover an upper surface and a side surface of the first conductive member.

8. The connecting structure according to claim 1,
wherein the second conductive member has higher conductivity than the first conductive member.

9. A bump which is used in the connecting structure as defined in claim 1.

10. A device-mounting substrate which is formed by the connecting structure as defined in claim 1.

* * * * *